United States Patent
Maeyama et al.

(10) Patent No.: US 9,738,014 B2
(45) Date of Patent: Aug. 22, 2017

(54) RESIN MOLDING MACHINE

(75) Inventors: Tetsuya Maeyama, Chikuma (JP);
Hidemichi Kobayashi, Chikuma (JP);
Shusaku Tagami, Chikuma (JP);
Yoshikazu Muramatsu, Chikuma (JP);
Takayuki Yamazaki, Chikuma (JP);
Keiji Koyama, Chikuma (JP); Hideaki Nakazawa, Chikuma (JP); Hiroshi Harayama, Chikuma (JP); Kenji Nishizawa, Chikuma (JP); Makoto Kawaguchi, Chikuma (JP); Masahiko Fujisawa, Chikuma (JP); Hidetoshi Oya, Chikuma (JP)

(73) Assignee: APIC YAMADA CORPORATION, Chikuma-Shi (JP)

( * ) Notice: Subject to any disclaimer, the term of this patent is extended or adjusted under 35 U.S.C. 154(b) by 425 days.

(21) Appl. No.: 13/303,340

(22) Filed: Nov. 23, 2011

(65) Prior Publication Data
US 2012/0135096 A1    May 31, 2012

(30) Foreign Application Priority Data

Nov. 25, 2010 (JP) ................................. 2010-262681
Dec. 17, 2010 (JP) ................................. 2010-281457
Aug. 17, 2011 (JP) ................................. 2011-178592

(51) Int. Cl.
*B29C 31/04* (2006.01)
*B29C 43/58* (2006.01)
(Continued)

(52) U.S. Cl.
CPC ............ *B29C 43/18* (2013.01); *B29C 31/008* (2013.01); *B29C 37/001* (2013.01);
(Continued)

(58) Field of Classification Search
CPC ............ B29C 2043/181; B29C 31/008; B29C 31/042; B29C 35/02; B29C 37/001; B29C 43/18; B29C 45/1468
(Continued)

(56) References Cited

U.S. PATENT DOCUMENTS 3,487,508 A * 1/1970 Baumgartner et al. ........ 425/219
4,624,810 A * 11/1986 Sisbarro ........................ 264/492
(Continued)

FOREIGN PATENT DOCUMENTS

EP    0 825 006 A1    2/1997
EP    1 147 870 A2    10/2001
(Continued)

*Primary Examiner* — Robert J Grun
(74) *Attorney, Agent, or Firm* — Birch, Stewart, Kolasch & Birch, LLP

(57) ABSTRACT

The compact resin molding machine is capable of efficiently performing a sequence of molding actions from feeding a work and resin to accommodating the molded work. The resin molding machine comprises: a work conveying mechanism including a robot, which has a robot hand for holding the work and which is capable of rotating and linearly moving; a work feeding section for feeding the work; a resin feeding section for feeding the resin; a press section including a molding die set, in which the work is resin-molded; a work accommodating section for accommodating the molded work; and a control section controlling the entire resin molding machine. The work feeding section, the resin feeding section, the press section and the work accommodating section are located to enclose a moving area of the robot of the work conveying mechanism.

16 Claims, 30 Drawing Sheets

(51) Int. Cl.
  *B29C 43/18* (2006.01)
  *B29C 31/00* (2006.01)
  *B29C 37/00* (2006.01)
  *H01L 21/56* (2006.01)
  *B29C 35/02* (2006.01)
  *B29C 45/14* (2006.01)

(52) U.S. Cl.
  CPC .......... *H01L 21/565* (2013.01); *B29C 31/042* (2013.01); *B29C 35/02* (2013.01); *B29C 45/1468* (2013.01); *B29C 2043/181* (2013.01); *H01L 2924/0002* (2013.01)

(58) Field of Classification Search
  USPC .......................................................... 425/130
  See application file for complete search history.

(56) References Cited

U.S. PATENT DOCUMENTS

| | | | | |
|---|---|---|---|---|
| 5,945,135 | A * | 8/1999 | Beane et al. | 425/260 |
| 6,007,316 | A | 12/1999 | Bandoh | |
| 6,050,802 | A * | 4/2000 | Kobayashi | 425/116 |
| 6,056,527 | A * | 5/2000 | Bunyan et al. | 425/113 |
| 6,080,354 | A * | 6/2000 | Miyajima | 264/511 |
| 6,350,113 | B1 * | 2/2002 | Miyajima | 425/89 |
| 7,255,817 | B2 * | 8/2007 | Tazawa et al. | 264/40.1 |
| 7,326,592 | B2 | 2/2008 | Meyer et al. | |
| 7,443,124 | B2 * | 10/2008 | Bischoff et al. | 318/568.17 |
| 2003/0140492 | A1 | 7/2003 | Venrooij et al. | |
| 2003/0178748 | A1 * | 9/2003 | Bolken et al. | 264/272.17 |
| 2006/0068524 | A1 | 3/2006 | Yamamoto | |
| 2006/0093692 | A1 * | 5/2006 | Miyajima et al. | 425/129.1 |
| 2007/0262049 | A1 * | 11/2007 | Miyajima et al. | 216/11 |
| 2009/0162467 | A1 * | 6/2009 | Uragami et al. | 425/139 |
| 2010/0131235 | A1 * | 5/2010 | Aoba | 702/153 |
| 2010/0159064 | A1 * | 6/2010 | Schittelkop | 425/577 |

FOREIGN PATENT DOCUMENTS

| | | |
|---|---|---|
| JP | H01-269512 A | 10/1989 |
| JP | 6-112243 A | 4/1994 |
| JP | 7-241874 A | 9/1995 |
| JP | 7-321137 A | 12/1995 |
| JP | 8-197571 A | 8/1996 |
| JP | H10-286699 A | 10/1998 |
| JP | H10-305439 A | 11/1998 |
| JP | 2006-027098 A | 2/2006 |
| JP | 2006-088692 A | 4/2006 |
| JP | 2006-287235 A | 10/2006 |
| JP | 2004-179460 A | 8/2007 |
| JP | 2007-190704 A | 8/2007 |
| JP | 2008-153491 A | 7/2008 |
| JP | 2008-221622 A | 9/2008 |
| JP | 2010-83027 A | 4/2010 |
| JP | 2011-023650 A | 2/2011 |
| JP | 2011-37031 A | 2/2011 |
| JP | 2012-045734 A | 3/2012 |
| JP | 2003-524896 A | 8/2013 |

* cited by examiner

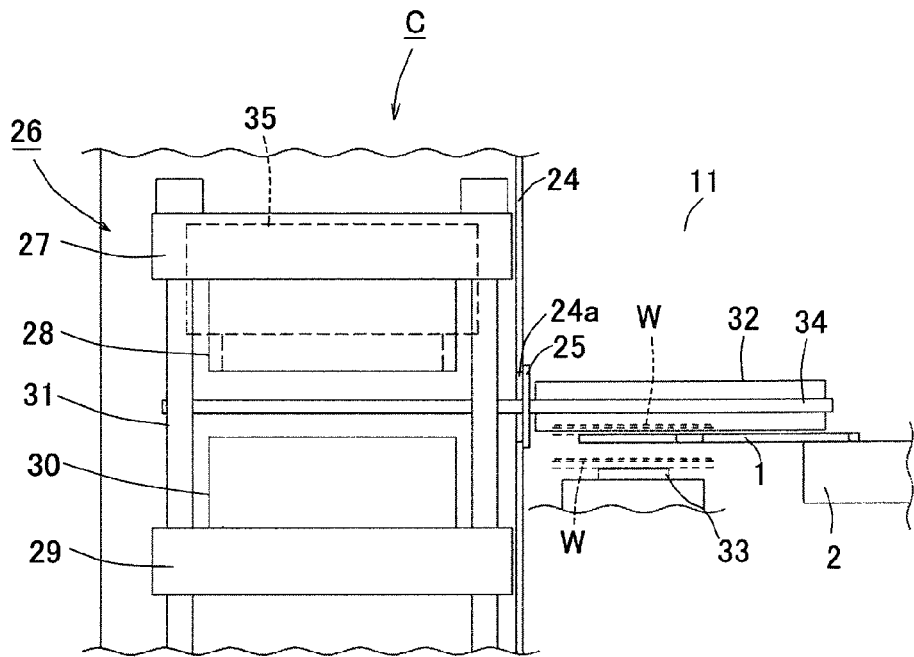
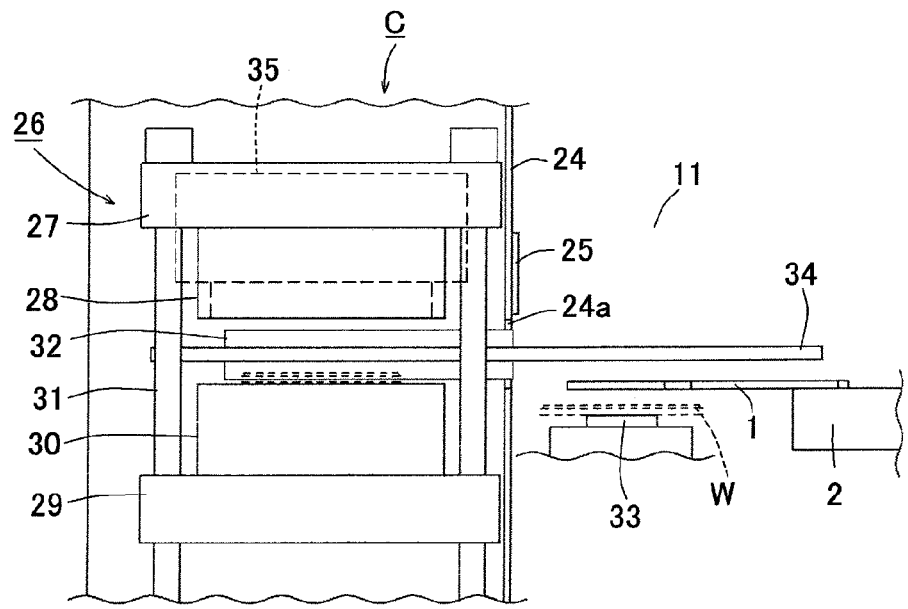

FIG.14A

| CONVEYING ORDER | WORK NUMBER | STARTING SECTION | DESTINATION SECTION | STARTING TIME |
|---|---|---|---|---|
| 11 | 1 | PRESS (26a) | EXAMINATION (41, 42) | t1 |
| 12 | 3 | DISPENSING UNIT (18f) | PRESS (26a) | t2 |
| 13 | 1 | EXAMINATION (41, 42) | CURING (43) | t3 |
| 14 | 4 | DISPENSING UNIT (18g) | PRESS (26b) | t4 |
| 15 | 2 | PRESS (26b) | EXAMINATION (41, 42) | t5 |
| 16 | 4 | DISPENSING UNIT (18g) | PRESS (26b) | t6 |
| 17 | 2 | EXAMINATION (41, 42) | CURING (43) | t7 |

FIG.14B

| PRIORITY | STARTING SECTION | DESTINATION SECTION | PURPOSE |
|---|---|---|---|
| 1 | RESIN FEEDING SECTION (B) | PRESS SECTION (C) | PREVENTION OF MOISTURE ABSORPTION, PREVENTION OF OVERHEAT |
| 2 | PRESS SECTION (C) | WORK EXAMINATION SECTION (D) | PREVENTION OF BENDING WORK |
| 3 | WORK EXAMINATION SECTION (D) | THERMALLY-CURING SECTION (E) | PREVENTION OF BENDING WORK |
| 4 | THERMALLY-CURING SECTION (E) | COOLING SECTION (N) | |
| 5 | COOLING SECTION (N) | WORK ACCOMMODATING SECTION (F) | |
| 5 | WORK FEEDING SECTION (A) | READING SECTION (I) | |
| 5 | READING SECTION (I) | RESIN FEEDING SECTION (B) | |

FIG.14C

| CONVEYING ORDER | WORK NUMBER | STARTING SECTION | DESTINATION SECTION |
|---|---|---|---|
| n | x | COOLING SECTION (N) | WORK ACCOMMODATING SECTION (F) |
| n+1 | y | RESIN FEEDING SECTION (B) | PRESS SECTION (C) |

| CONVEYING ORDER | WORK NUMBER | STARTING SECTION | DESTINATION SECTION |
|---|---|---|---|
| n | y | RESIN FEEDING SECTION (B) | PRESS SECTION (C) |
| n+1 | x | COOLING SECTION (N) | WORK ACCOMMODATING SECTION (F) |

FIG.24
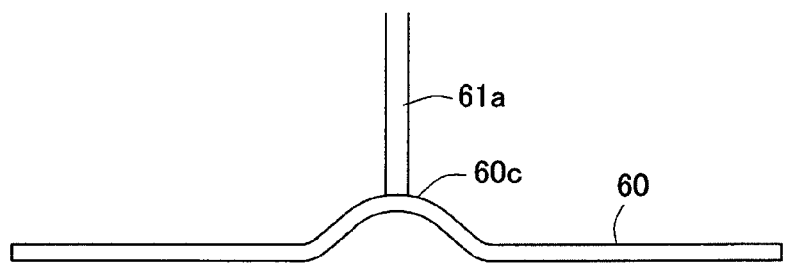
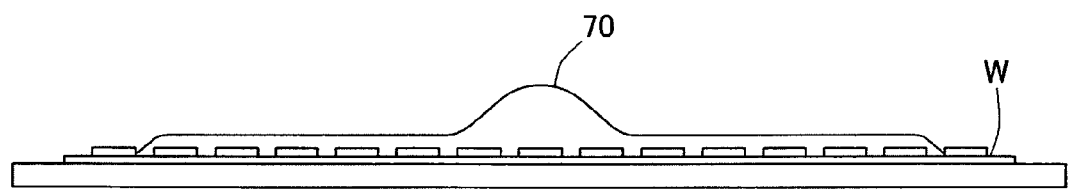

RESIN MOLDING MACHINE

CROSS-REFERENCE TO RELATED APPLICATION

This application is based upon and claims the benefit of priority of: the prior Japanese Patent Application No. P2010-262681, filed on Nov. 25, 2010; the prior Japanese Patent Application No. P2010-281457, filed on Dec. 17, 2010; and the prior Japanese Patent Application No. P2011-178592, filed on Aug. 17, 2011, and the entire contents of which are incorporated herein by reference.

FIELD

The present invention relates to a resin molding machine capable of molding a work, in which a semiconductor chip is held on a carrier, with resin.

BACKGROUND

A conventional resin molding machine is disclosed in Japanese Laid-open Patent Publication No. P2010-83027. In case of feeding works to pluralities of press sections for resin molding, the work and resin (e.g., tablet resin, liquid resin, powder resin, granular resin, paste resin) are conveyed and set, by a loader, in a molding die set of each of the press sections. The work and the resin are clamped by and resin-molded in the molding die set. To efficiently resin-mold the works in the pluralities of press sections, the loader and a pressure reduction unit are shared by the pluralities of press sections to downsize the machine. Further, a molding cycle is corresponded to the resin molding action of the slowest press section.

These days, compact and thin electronic appliances have been required. Thus, a method of producing a semiconductor device capable of improving handling and production efficiency is disclosed in Japanese Laid-open Patent Publication No. P2006-287235. The method comprises the steps of: adhering semiconductor chips onto a carrier plate; resin-molding the semiconductor chips; and separating the molded semiconductor chips as pieces of semiconductor devices. The semiconductor chips are adhered onto the carrier plate by adhesive tapes. After the resin molding, the adhesive tapes are removed from the carrier plate, then electrodes are formed, the molded work is polished and the molded semiconductor chips are separated as the semiconductor devices.

Further, a resin molding machine is disclosed in Japanese Laid-open Patent Publication No. P2011-37031. In case of using granular resin, the granular resin will be scattered while works, on which the granular resin has been fed by a dispenser, are conveyed to each of press sections. If the granular resin is scattered, cleanliness of the machine is lowered. Further, cleaning operation for removing the scattered resin must be required. To solve these problems, in the disclosed molding machine, granular resin is previously fed onto a long release film, which is wound on a feeding roller and extended onto a hot plate, and the release film is sucked and held on a lower die. On the other hand, a work is sucked and held on an upper die. Then, the lower die and the upper die are closed to perform resin molding. After completing the resin molding, the release film is separated from a molded product and wound on a collecting roller. Especially, in case of producing circular products, the granular resin must be perfect-circularly fed to a center of a work so as to prevent inferior molding (e.g., imperfect molding).

Further, a resin molding machine is disclosed in Japanese Laid-open Patent Publication No. P2008-221622. In the resin molding machine, granular resin is not directly fed onto a work. Granular resin is dropped into a resin storing section of a resin storing plate for temporary molding, by a linear vibration feeder, with scanning the resin storing plate, so as to feed the granular resin with uniform thickness. Then, an opening section of the resin storing section is closed by a release film. The resin storing plate is inverted, and then the resin storing plate is held by an inloader, the release film is set on a cavity concave section of a lower die, sucking the release film is stopped to release the release film from the resin storing plate, and the release film is sucked and held on a clamping face of the lower die including the cavity concave section. Therefore, scattering the granular resin can be prevented when the granular resin is fed into the cavity concave section at a time.

Some resin molding machines include: units for not only feeding a work into a press section but also judging if a molded work is good or bad; thermally curing the good work; and accommodating the cooled work. These days, compactly placing the constituent units and improving working efficiency, with linking the units with each other, are required. For example, in case of feeding works together with liquid resin and feeding the liquid resin to pluralities of press sections by one dispenser, a time for dispensing the liquid resin, whose temperature must be suitably controlled, must be long, so production efficiency must be lowered.

A structure capable of efficiently perform the sequential actions (e.g., resin-molding different works in pluralities of press sections, thermally curing good molded works) is not disclosed in any publication documents. Even if units for performing said actions are merely gathered, an install area must be large, maintenance must be troublesome, and control actions must be complex.

In case of using a thermal release tape, which has a thermal foaming property, as an adhesive tape for adhering a semiconductor chip onto a carrier plate, if the thermal release tape is excessively heated, by heat conducted from a surface of a molding die, in a process of feeding the carrier plate to the molding die and performing the resin molding action, adhesive force of the thermal release tape is reduced. By reducing the adhesive force, a separated semiconductor wafer (semiconductor chip) will be displaced by flowage of resin. This problem is called "flying die".

Further, in case of resin-molding semiconductor chips, which are mounted on a semiconductor wafer or a circuit board, at a time, if the work is fed to a molding die previously heated, viscosity of resin is increased and cross-linking reaction of the resin starts when the work is mounted on or sucked onto the molding die. Therefore, even if the molding die is clamped, flowability of the resin is lowered and the work cannot be perfectly molded.

Especially, in case of resin-molding semiconductor wafers of 8 inches, 12 inches, etc. by transfer molding method or compression molding method, a flow area of resin is increased but a thickness of the resin is decreased, so curing the resin is accelerated by heat conducted from a clamping face of a molding die. Therefore, quality of molded products must be lowered.

There is a possibility that resin powders are scattered while a work, to which the resin has been fed, is conveyed from a resin feeding section to a press section, so it is difficult to treat the work. Scattering resin powders is caused by a work conveying action performed by, for example, a robot hand, or air streams caused by an air conditioner of a clean room. It is troublesome to remove the scattered resin powders.

In case of the method disclosed in Japanese Laid-open Patent Publication No. P2011-37031, wherein the granular resin is dropped onto the long release film and set in the press section together with the release film to mold the work, a shape of the temporarily-molded granular resin will be unstable (a surface of the temporarily-molded granular resin will easily become uneven surface). Therefore, air will be involved in the resin when the work is set in the cavity and thermally cured. Further, wrinkles will be easily formed in the release film, so quality of the molded product must be lowered.

In case of the method disclosed in Japanese Laid-open Patent Publication No. P2008-221622, wherein the release film is sucked and held on the clamping face of the lower die, including the cavity concave section, so as to feed the granular resin from the resin storing section to the cavity concave section at a time, it is difficult to hold the release film in the cavity concave section without forming wrinkles. Further, it is difficult to realize a compact resin molding machine, which is capable of performing the sequential processes of feeding the works, resin-molding the works, thermally curing only the good molded works and accommodating the cured works.

SUMMARY

The present invention solves the problems of the above described conventional resin molding machines.

A first object of the present invention is to provide a compact resin molding machine capable of efficiently performing the sequential processes of feeding a work, molding the work with resin and accommodating a molded product.

A second object of the present invention is to provide a resin molding machine capable of preventing an adhesive sheet, which is used to adhere a semiconductor chip, from reduction of adhesive force by lowering thermal conductivity of a work and securing flowability of resin by restraining increase of viscosity of the resin, so as to improve quality of the molded product.

A third object of the present invention is to provide a resin molding machine capable of preventing granular or powder resin from being scattered, improving handleability and reducing a maintenance cost.

To achieve the objects the resin molding machine of the present invention has following structures.

Firstly, the resin molding machine of the present invention comprises:
  a work conveying mechanism including a robot, which has a robot hand for holding a work and which is capable of rotating and linearly moving so as to convey the work between following processing sections;
  a work feeding section for feeding the work;
  a resin feeding section for feeding resin, which is used for resin molding, to the work conveyed from the work feeding section;
  a press section including a molding die set, in which the resin fed by the resin feeding section and the work are set and the work is resin-molded;
  a work accommodating section for accommodating the work which has been resin-molded in the press section; and
  a control section controlling actions of the entire resin molding machine, and the work feeding section, the resin feeding section, the press section and the work accommodating section are located to enclose a moving area of the robot of the work conveying mechanism.

With this structure, the work feeding section, the resin feeding section, the press section and the work accommodating section are located to enclose the moving area of the robot of the work conveying mechanism, so that the processing sections and the control section can be compactly arranged. Further, the sequential processes, from feeding the work and the resin to accommodating the molded work, can be efficiently performed according to products.

Preferably, the molding die set includes a work supporting section,
  the work supporting section supports a carrier plate, which has an adhesive sheet having a semiconductor chip holding face, on which resin is fed, in a state where the carrier plate is separated from a clamping face of a molding die, and
  the work supporting section is capable of retracting into the molding die set from the clamping face while the molding die set is in a clamping state.

With this structure, the work supporting section supports the carrier plate, which has the adhesive sheet having the semiconductor chip holding face, on which the resin is fed, in the state where the carrier plate is separated from the clamping face of the molding die. Even if the work is fed into the preheated molding die set, it is difficult to conduct heat from the clamping face immediately before the resin extends on the adhesive sheet, so that displacement of the semiconductor chip and moving the semiconductor chip together with the flowing resin can be prevented.

Since it is difficult to conduct heat from the clamping face to the work, viscosity of the resin whose gel time is short can be increased before extending the resin and flowability of the resin can be lowered. Therefore, insufficient molding can be prevented, and quality of the molded product can be improved.

Note that, the work supporting section is capable of retracting into the molding die set from the clamping face while the molding die set is in the clamping state, so the molding action is not interfered.

Preferably, the work feeding section, the resin feeding section, the press section and the work accommodating section are located to enclose a moving area of the robot of the work conveying mechanism,
  the resin for molding is fed to the work, which has been taken out from the work feeding section, in the resin feeding section, and
  the work, to which the resin has been fed, is conveyed to the press section in a state where the work is shielded by a windshield.

With this structure, the work is conveyed to the press section in the state where the work is shielded by the windshield, so no resin powders are scattered from the work. Therefore, handleability of the resin can be improved, and a maintenance cost can be reduced.

In the resin molding machine of the present invention, the structure, which is capable of efficiently performing the sequential processes from feeding the work to accommodating the molded work, can be downsized. Further, the resin molding action can be optionally performed according to types of the products.

Heat conductivity to the work, which is set in the molding die set, is lowered so as to prevent reduction of the adhesive force of the adhesive sheet, which adheres the semiconductor chip, and restrain increase of viscosity of the resin fed on to the adhesive face to secure flowability of the resin. Therefore, quality of the molded product can be improved.

The sequential processes, from feeding the work to accommodating the molded work, can be efficiently performed by the compact resin molding machine. Further, scattering resin powders or granular resin, which is fed to the work, can be prevented, so that handleability of the resin can be improved, and a maintenance cost can be reduced.

BRIEF DESCRIPTION OF THE DRAWINGS

Embodiments of the present invention will now be described by way of examples and with reference to the accompanying drawings, in which:

FIGS. 7A and 7B are explanation views showing an action of feeding the work into a press section;

FIGS. 14A-14C are tables stored in a memory unit, which show conveyance order of the works, process priority and changing conveyance order;

FIG. 24 includes an explanation view of another blade and an explanation view, in which granular resin is leveled by the blade;

DETAILED DESCRIPTION OF THE EMBODIMENTS

Preferred embodiments of the present invention will now be described in detail with reference to the accompanying drawings. In each of the following embodiments, a press section performs compression molding, a lower molding die is a movable die and an upper molding die is a fixed die.

Overall Structure of Resin Molding Machine

Figure 1:
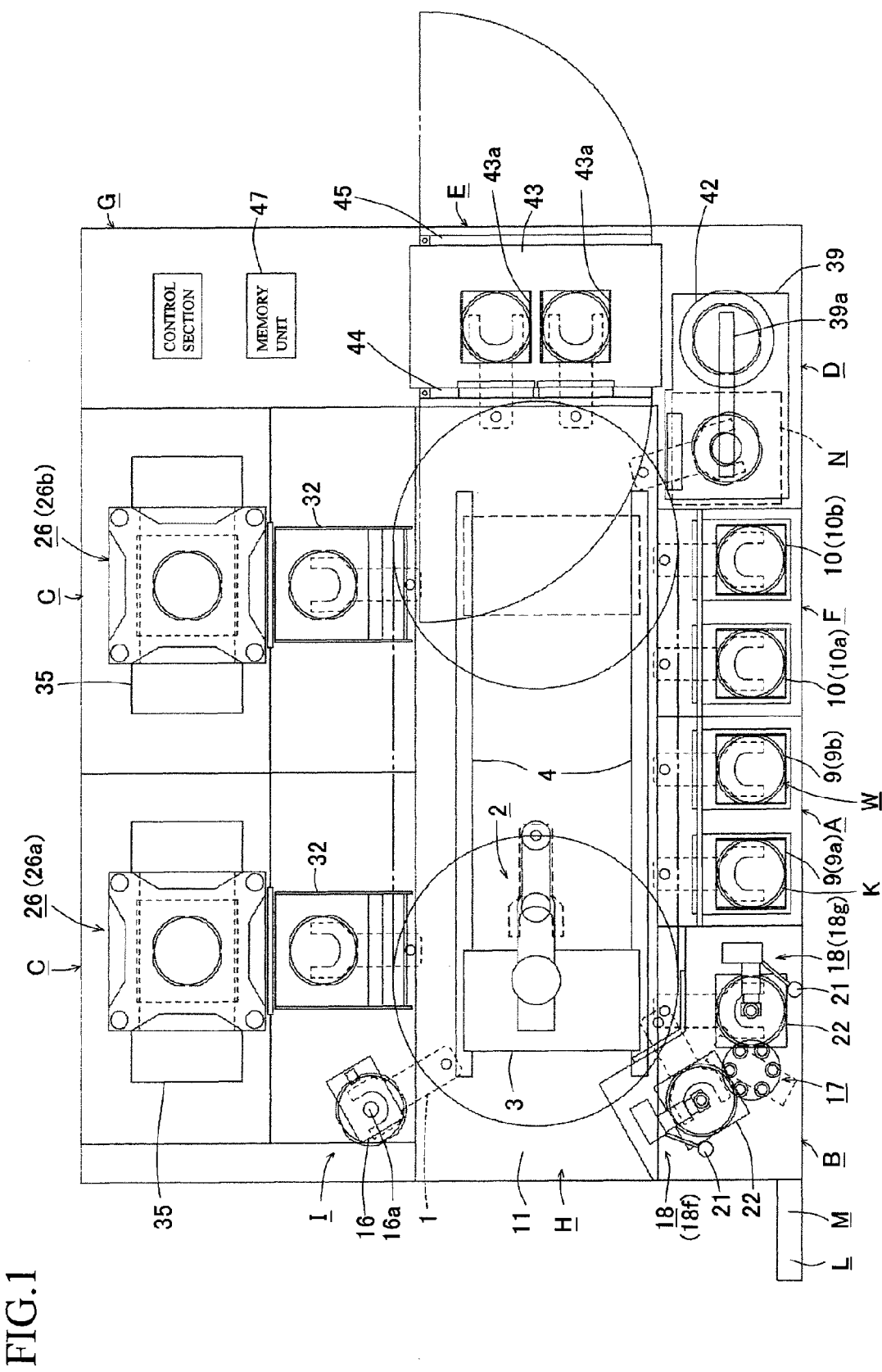
FIG. 1 is a plan view of a resin molding machine, which shows an overall structure.

FIG. 1 is a plan view of an embodiment of the resin molding machine of the present invention. In the present embodiment, processing sections including a work feeding section A, a resin feeding section B, press sections C, a work examination section (cooling section) D, a thermally-curing section E and a work accommodating section F and a control section G for controlling the processing sections are located to enclose a moving area of an articulated robot of a work conveying mechanism H. A data reading section I is located in the vicinity of the press sections C. An indicating section L and an operating section M are located in the vicinity of the resin feeding section B. By locating the sections to enclose the moving area of the articulated robot, moving distances of works can be shortened so that the works can be conveyed efficiently. Each of the sections will be explained concretely.

In FIG. 1, a work W includes a carrier on which semiconductor chips are mounted. The work W is resin-molded by E-WLP (Embedded-Wafer Level Package) method or eWLB (embedded Wafer Level BGA) method. Concretely, an adhesive sheet (adhesive tape) having thermal abrasion property is adhered on a carrier plate K composed of a metal (e.g., stainless steel), and matrix of the semiconductor chips are adhered on the adhesive sheet. In this case, a size of the carrier plate K is equal to that of a semiconductor wafer so as to share peripheral units, e.g., wafer conveying jig. For example, the carrier plate K is formed into a circular shape having a diameter of 12 inches (about 30 cm). The carrier plate K may be formed into a polygonal shape. A data code (e.g., QR code, barcode), which includes data of a product, is attached to an outer edge of the work W. Note that, the carrier plate K may be formed into a rectangular shape. Preferably, in this case, the semiconductor chips are metrically arranged and an unarrayed area, in which no semiconductor chips are arrayed, is highly reduced so as to improve production efficiency.

The work W for WLP (Wafer Level Package), in which a wafer ball-mounted on a rewiring layer is resin-molded, may be processed instead of the work W for the E-WLP or eWLB method, in which semiconductor chips are mounted on the carrier plate K. In this case, the data code may be attached to the wafer itself or each storing slit (accommodating place) of a magazine for storing the works W. Further, the work W may be a plastic substrate, on which a semiconductor chip or chips are mounted, or a lead frame.

Indicating Section L and Operating Section M

As shown in FIG. 1, the indicating section L and the operating section M are integrated. An operator reads data indicated by the indicating section L and can manually control the processing sections (e.g., articulated robot) of the resin molding machine by the operating section M. Further, various data can be inputted and changed by the operating section M. Note that, by using communication lines, the indicating section and the operating section may be separated so as to remote-control the resin molding machine.

Work Conveying Mechanism H

Figure 2A:
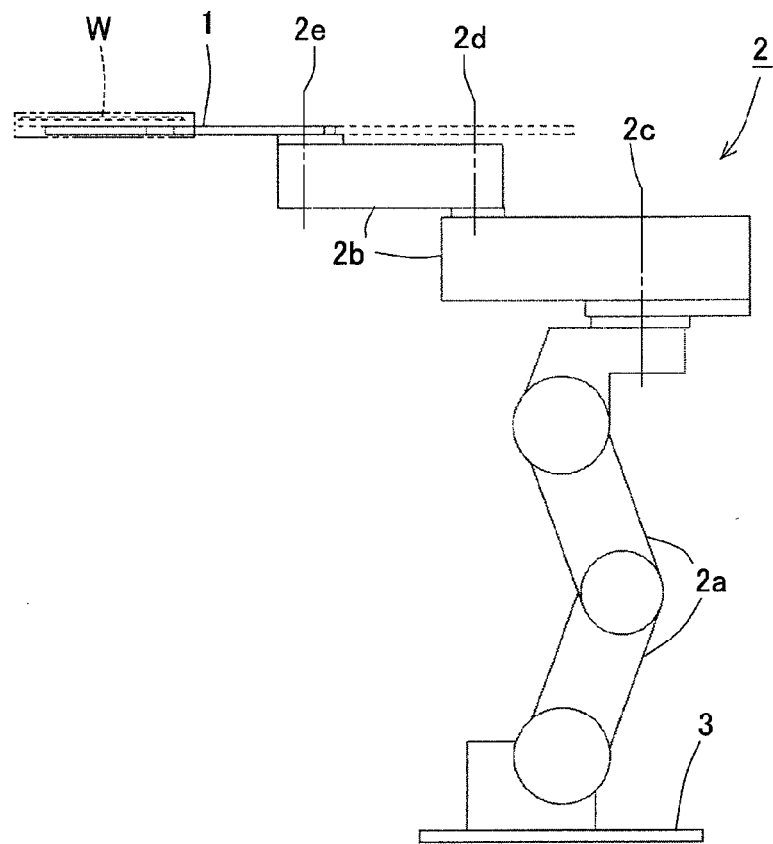
FIG. 2A is a side view of an articulated robot.

As shown in FIG. 2A, the work conveying mechanism H includes the articulated robot 2, which has a robot hand 1 for holding the work W and which is capable of rotating and linearly moving so as to convey the work W between the processing sections. The articulated robot 2 is constituted by a vertical robot section including vertical links 2a, which are foldable and capable of moving in the vertical direction, and a horizontal robot section including horizontal links 2b, which is capable of rotating and moving in the horizontal plane. The robot hand 1 is attached to a front end of the horizontal link 2b. The robot hand 1 and the two links 2b are pivotably connected by vertical shafts 2c, 2d and 2e. The links 2a and 2b are driven by servo motors, each of which has an encoder for detecting rotational angle to perform feedback control. By employing the articulated robot 2, vertically moving the robot hand 1 to an optional position and horizontally moving the robot hand 1 to the optional position can be performed simultaneously. Therefore, the work W can be linearly conveyed between the processing sections, which are located to enclose the moving area of the articulated robot 2, so that conveying time can be shortened. Therefore, the work W can be rapidly conveyed to the processing section of the following step (e.g., feeding the work W and liquid resin to the press section C, resin-molding the work W in the press section C), so that quality of the molded work W can be improved.

Figure 2B:
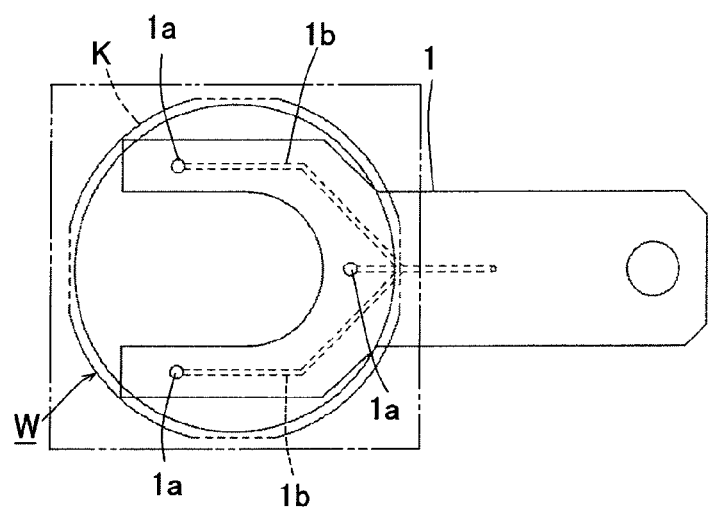
FIG. 2B is an explanation view of a robot hand.

As shown in FIG. 2B, a front end part of the robot hand 1 is formed into U-shape, so that an outer part of the work W can be held without holding a center part thereof. As shown in the drawing, three sucking holes 1a for sucking the outer part of the work W and sucking paths 1b communicated to the sucking holes 1a are formed in the front end part of the robot hand 1. The robot hand 1 sucks and holds a bottom face of the carrier plate K. Note that, the robot hand 1 may mechanically chuck the work W by, for example, chucking claws, instead of sucking the work W. Further, the robot hand 1 may be rotated about a horizontal shaft, instead of rotating about the vertical shafts, so as to invert the work W.

In FIG. 1, a base section 3 of the articulated robot 2 is capable of reciprocally moving along guide rails 4. For example, ball bearing screws are screwed with nuts of the base section 3, and the ball bearing screws are rotated in the both directions (a normal direction and a reverse direction) so as to reciprocally move the articulated robot 2 along the guide rails 4.

Figure 3A:
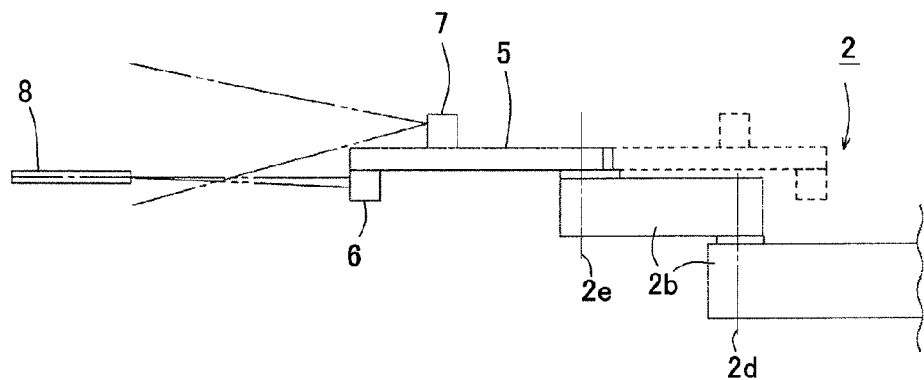
FIGS. 3A and 3B are explanation views showing actions of a teaching hand in a height direction, an X-direction and a Y-direction.
Figure 3B:
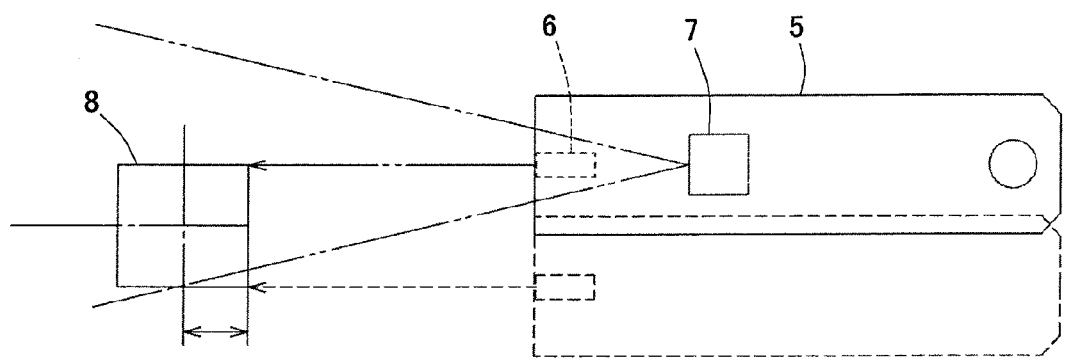

In FIGS. 3A and 3B, a teaching hand 5, which includes laser displacement gauges 6 and an imaging unit (camera) 7, is attached to the articulated robot 2, instead of the robot hand 1, when the work conveying mechanism H is assembled. In each of the processing sections, a position of a teaching jig 8, which is located at a work exchanging position, in the X-, Y- and Z-directions, is defined by the teaching hand 5. For example, the teaching jig 8 is formed into a rectangular shape and has a prescribed size. Concretely, a general location of the teaching hand 5 is defined with indicating the image obtained by the imaging unit 7 on a screen of the indicating section L. Next, the laser displacement gauges 6 emit laser beams toward the teaching jig 8, and the vertical links 2a are vertically moved to detect edges of the teaching jig 8, so that a height of the teaching jig 8, in the Z-direction, can be defined. Further, as shown in FIG. 3B, the horizontal links 2b are horizontally moved to detect edges of the teaching jig 8, so that a planar position of the teaching jig 8, in the X- and Y-directions, can be defined.

Next, the teaching action will be concretely explained in detail.

Firstly, the teaching jig 8 is set to align a center of the teaching jig 8 with a center of the work exchanging position of each of the processing sections. Note that, the work exchanging position of each of the processing sections is shown, in FIG. 1, as a position of the robot hand 1 indicated by dotted lines. Next, the articulated robot 2 is driven, by the operating section M, so as to move the teaching hand 5 to a position short of the teaching jig 8, with monitoring image, which is obtained by the imaging unit 7 and shown by the indicating section L. With this action, a general position of the teaching hand 5 is defined. A distance between the teaching hand 5 and the teaching jig 8 is measured by the laser displacement gauges 6. The center of the work exchanging position with respect to the teaching hand 5, in a width direction of the teaching jig 8, can be measured on the basis of the measured distance and a width (front-back direction of FIG. 1) of the teaching jig 8.

Next, by moving the teaching hand 5 rightward and leftward with respect to the teaching jig 8, both sides of the teaching jig 8 are detected as edges of output values of the laser displacement gauges 6. A middle position between the both sides is measured as the position of the center of the work exchanging position in the left-right direction, with respect to the teaching hand 5. Then, the teaching hand 5 is moved upward and downward, with respect to the teaching jig 8, so as to detect an upper side of the teaching jig 8. A height of a work mounting surface of the work exchanging position can be measured on the basis of the position of the upper side and a thickness of the teaching jig 8. A coordinate of the work exchanging position of each processing section can be defined on the basis of the distances from the teaching hand 5 in the X-, Y- and Z-directions.

The precise coordinate of the work exchanging position of each of the processing sections, in the X-, Y- and Z-directions, can be measured by the teaching hand 5 and the teaching jig 8 and stored in a memory unit 47. The control section G controls actions of the articulated robot 2 on the basis of the stored coordinates. The teaching jig 8 is formed into the rectangular shape in the present embodiment, but the shape of the teaching jig 8 is not limited as far as relative positional relationship in the X-, Y- and Z-directions can be measured. Note that, in case that one processing section, e.g., thermally-curing section E, cooling section N, has pluralities of the work exchanging positions, a coordinate of one of the work exchanging positions is measured by the above described manner, and a coordinate of another work exchanging position may be measured on the basis of the measured coordinate. Further, coordinates of the all work exchanging positions may be measured by the above described manner.

As described above, the precise position control of the articulated robot 2, which conveys the works between the processing sections located around the moving area of the articulated robot 2, can be performed, by the simple structure, when the articulated robot 2 is assembled. Therefore, high assembling accuracies of the processing sections are not required, so that the resin molding machine can be easily assembled and a total production cost can be highly reduced.

Note that, a horizontal articulated robot, a vertical articulated robot, other robots, other actuators or a combination of them may be employed instead of the articulated robot 2. Pluralities of the articulated robots 2 may be employed according to number of the press sections C. In this case, one of the articulated robots 2 may convey the works W between the work feeding section A and the press sections C, and another articulated robot 2 may convey the works W between the press sections C and the work accommodating section F. With this structure, pluralities of the works W can be resin-molded simultaneously. Production efficiency can be further improved.

Work Feeding Section A, Work Accommodating Section F and Data Reading Section I

In FIG. 1, the work feeding section A and the work accommodating sections F are located on the front side of the guide rails 4, along which the articulated robot 2 is moved. Concretely, two blocks of work feeding magazines 9, in which the works W to be molded are stored, are provided in the work feeding section A, and two blocks of work accommodating magazines 10, into which the molded works W are accommodated, are provided in the work accommodating section F. The work feeding magazines 9 and the work accommodating magazines 10 have the same structure, so the structure of only the work feeding magazine 9 will be explained later. The two magazines 9 or 10 are used for storing or accommodating the works W of same type or different types. Note that, one block of the work feeding magazines 9 and one block of the work accommodating magazines 10 may be provided. Further, three or more blocks of the work feeding magazines 9 and three or more blocks of the work accommodating magazines 10 may be provided. Tightly-closed carrying containers, e.g., FOUP, may be used as the work feeding magazines 9 and the work accommodating magazines 10.

Figure 4:
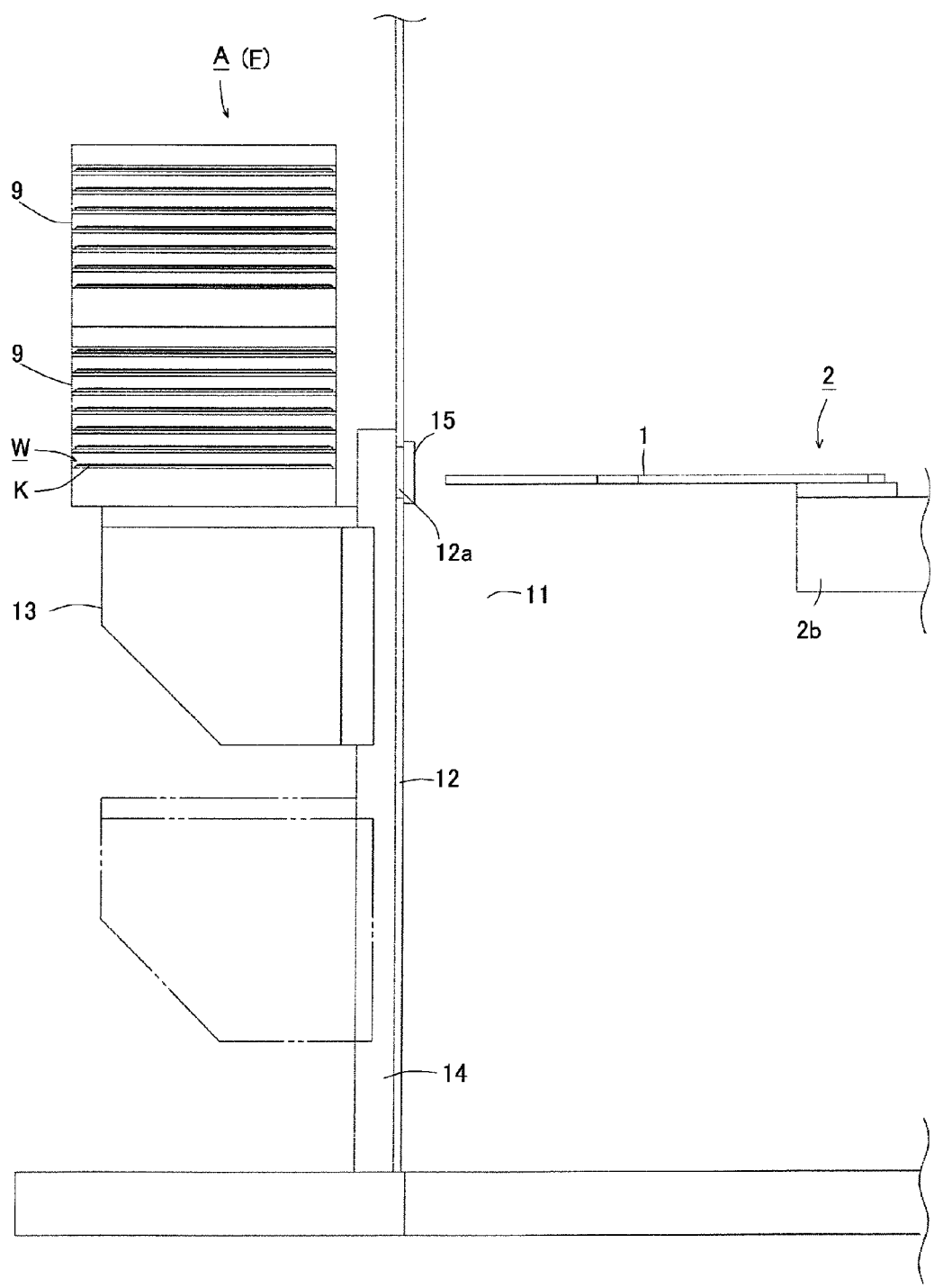
FIG. 4 is an explanation view of a work feeding section.

The structure of the work feeding section A will be explained with reference to FIG. 4. A conveying area 11, in which the articulated robot 2 can be moved, and the work feeding section A (the work accommodating section F) are partitioned by a partition wall 12 so as to store the works W under clean and nonheat-affected atmosphere. The work feeding magazines 9 are vertically moved by a known elevating mechanism 13. The elevating mechanism 13 is capable of vertically moving the work feeding magazines 9, by a suitable means (e.g., endless belt, chain driven by a driving source), along a vertical guide 14. The two work feeding magazines 9 are stacked in the one block. Slits (or grooves) are formed on both inner side faces of each of the work feeding magazines 9, and the carrier plate K of the work W is inserted and supported in each of the pair of slits. An opening 12a is formed in the partition wall 12. The opening 12a is located near an uppermost position of the elevating mechanism 13. The opening 12a is closed by an open-close shutter 15. The shutter 15 is actuated by a suitable driving mechanism (e.g., solenoid, cylinder unit).

Next, an action for taking out the work W from the work feeding section A will be explained with reference to FIGS. 5A-5C.

Figure 5A:
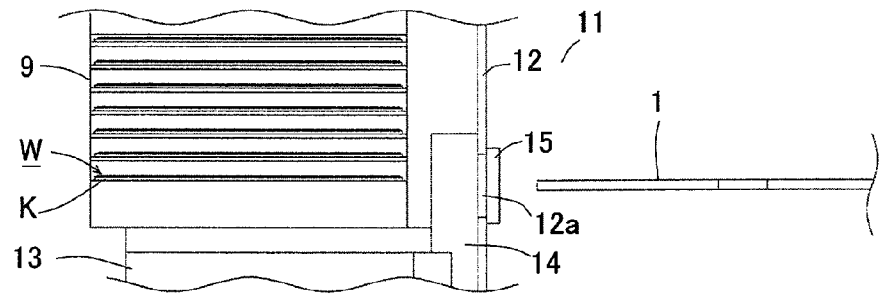
FIGS. 5A-5C are explanation views, in which the articulated robot takes out works from the work feeding section and takes the works into a work accommodating section.

In FIG. 5A, the elevating mechanism 13 is moved along the elevating guide 14 and located at the uppermost position. The lowermost work W, which is stored in the work feeding magazine 9, faces the opening 12a. In this state, the articulated robot 2 is driven to move the robot hand 1 until facing the shutter 15.

Figure 5B:
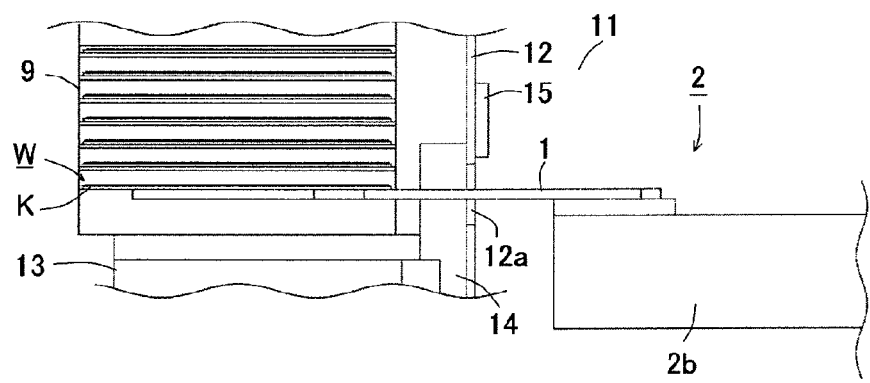

Next, as shown in FIG. 5B, the control section G controls the driving mechanism to open the shutter 15 and controls the robot hand 1 to get into a space under the lowermost work W, through the opening 12a. Then, the robot hand 1 is slightly moved upward to contact and receive the work W. The robot hand 1 sucks and holds the work W. Further, the robot hand 1 takes out the work W, along the slits, from the work feeding magazine 9. And then, the work W is conveyed to the outside of the partition wall 12 (into the conveying area 11) through the opening 12a.

Figure 5C:
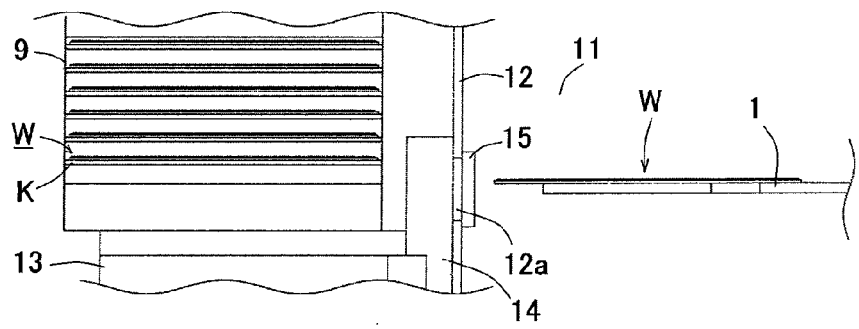

Then, as shown in FIG. 5C, the shutter 15 is closed, and the articulated robot 2 conveys the work W to the data reading section I. The elevating mechanism 13 is downwardly moved a prescribed distance so as to align the next work W with the opening 12a. This action is repeated to take out the following works W.

Note that, in the work accommodating section F, the robot hand 1, which sucks and holds the molded work W, gets into the work accommodating section F, along the pair of slits, from the conveying area 11. By releasing the suction of the robot hand 1, the molded work W is received by the pair of slits of the work accommodating section F. Other actions in the work accommodating section F are the same as those in the work feeding section A.

In FIG. 1, the data reading section I includes a code reading unit 16 and an aligner 16a. The aligner 16a, which has received the work W conveyed from the work feeding magazine 9, is turned to move the data code of the work W to a position immediately under the code reading unit 16. In this action, the work W is headed in a prescribed direction. The code reading unit 16 reads the data code (e.g., QR code, barcode) attached to the work W. Resin data (e.g., type, amount fed, feeding time), molding data (e.g., assigned number of a press unit, pressing time, pressing temperature, thickness of resin molding), curing data (e.g., curing temperature, curing time), cooling data (e.g., cooling time), etc., which correspond to the data code, are stored in the memory unit 47. The conveyed work W is processed in the processing sections on the basis of the stored processing data corresponding to the data code read by the data reading unit 16. The articulated robot 2 sequentially conveys the work W, whose processing data are read from the memory unit 47, to the following processing sections (i.e., from the resin feeding section B to the work accommodating section F).

Resin Feeding Section B

In FIG. 1, the resin feeding section B is located next to the work feeding section A. The resin feeding section B includes a revolver-type syringe holding unit 17, in which pluralities of syringes are set in a rotary holder, and two dispensing units 18, which are respectively located on the both sides of the syringe holding unit 17. Temperature and humidity of an inner space of the resin feeding section B can be adjusted so as to cool and dehumidify resin. A door is provided in a side face of the resin feeding section B so as to manually exchange the syringes.

Figure 6:
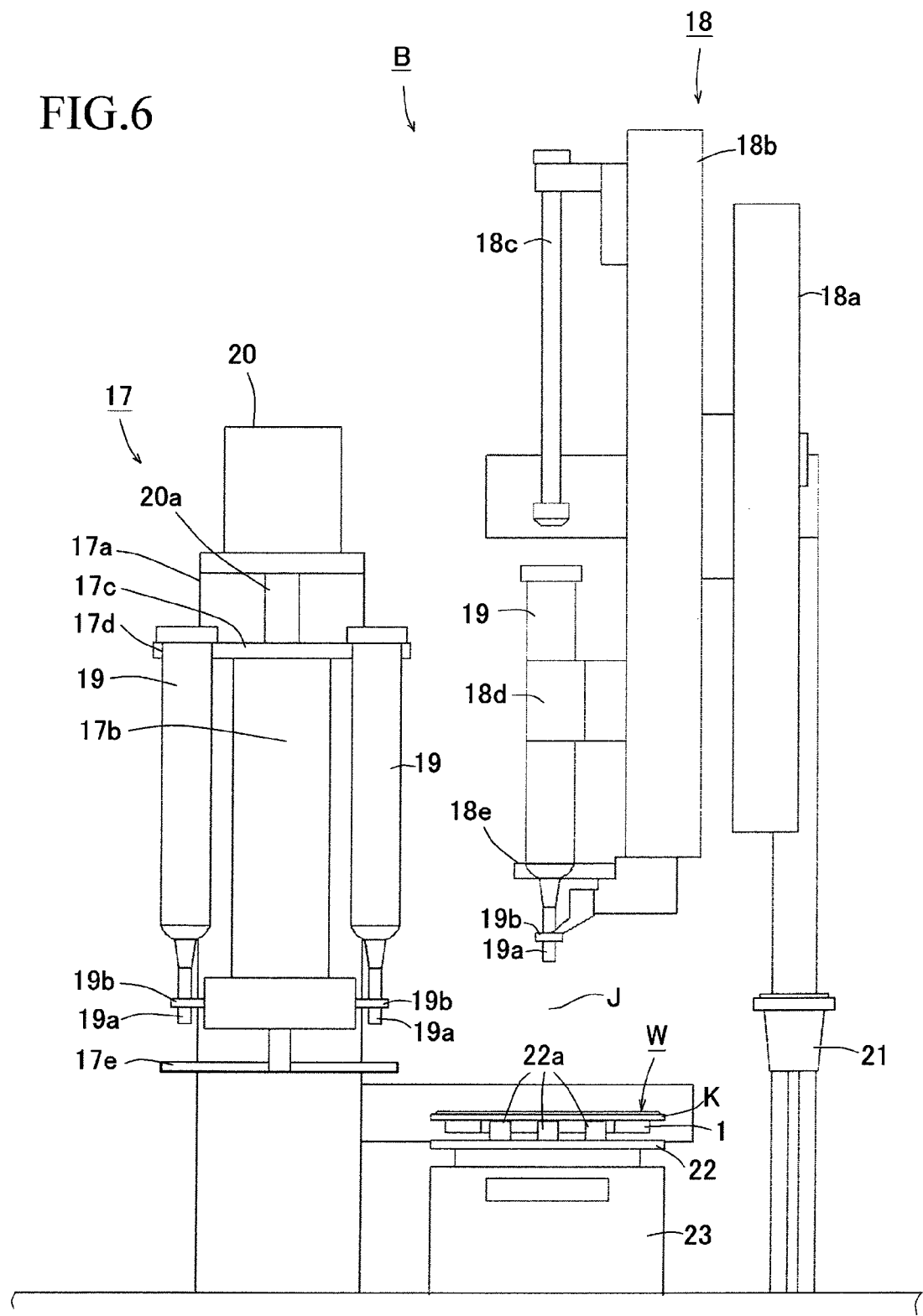
FIG. 6 is an explanation view of an example of a resin feeding section.

In FIG. 6, the syringe holding unit 17 includes a main body part 17a and the rotary holder 17b, which is rotatably held by the main body part 17a. Each of the syringes 19 stores a prescribed amount of thermosetting resin (e.g., silicone resin, epoxy resin). The syringes 19 are respectively set in six concave sections 17d, which are formed in a flange 17c provided in an upper part of the rotary holder 17b and arranged in the circumferential direction. A resin receiving part 17e is provided under the rotary holder 17b. Even if liquid resin leaks from tube nozzles 19a, which are respectively formed lower ends of the syringes 19, the resin can be received by the resin receiving part 17e. A motor 20 is provided to an upper end of the main body part 17a, and a motor shaft 20a of the motor 20 is connected to the flange 17c. By starting the motor 20, the rotary holder 17b is rotated in a prescribed direction. Note that, pinch valves 19b, whose height corresponds to that of the tube nozzles 19a, are located at lower end of the rotary holder 17b. The pinch valves 19b are capable of pinching and closing the tube nozzles 19a so as to prevent the liquid resin from dropping downward.

One of the dispensing units 18 will be explained with reference to FIG. 6. The other dispensing unit 18 is located on the other side of the syringe holding unit 17, but it has the same structure, so explanation will be omitted. The dispensing unit 18 includes a main body part 18a, which is capable of moving to and away from the syringe holding unit 17, and a piston holding unit 18b, which is held by the main body part 18a and capable of moving upward and downward. A piston 18c, which is capable of moving upward and downward, is provided to an upper part of the piston holding unit 18b. A chuck 18d, which receives and holds the syringe 19, is provided to the piston holding unit 18b and located under the piston 18c. A guide 18e, which correctly holds postures of the syringe 19 and the tube nozzle 19a, is located under the chuck 18d. By starting a driving source (e.g., motor, cylinder unit), not shown, the main body part 18a is moved from a waiting position, which is separated from a liquid dispensing position J, toward the syringe holding unit 17 so as to hold the syringe 19 by the chuck 18d. Then, the main body part 18b, which is holding the syringe 19, is moved to the liquid dispensing position J and opens the pinch valve 19b. Next, the piston 18c is moved downward, by a driving source (e.g., cylinder unit, motor), not shown, and press-fitted into the syringe 19, so that the liquid resin is dispensed onto the work W from the tube nozzle 19a. Upon dispensing a prescribed amount of the liquid resin onto the work W, the piston 18c is stopped and the pinch valve 19b closes the tube nozzle 19a, so that excessively feeding the liquid resin and contaminating the resin molding machine can be prevented.

A disposal cup 21 is provided in the vicinity of the main body part 18a. Quality of the liquid resin which stays in a lower end part of the tube nozzle 19a will deteriorate. Thus, the deteriorated resin in the lower end is discharged into the disposal cup 21 when the liquid resin is dispensed from the syringe 19. The disposal cup 21 is turned to the liquid dispensing position J before the liquid resin is dispensed onto the work W so as to dispose the deteriorated resin.

A work mounting part 22, onto which the work W transferred from the robot hand 1 is mounted, at the liquid dispensing position J. The robot hand 1 put the work W into the resin feeding section B until supporting projections 22a are between two hand fingers (see FIGS. 1 and 6), so that the carrier plate K is set on the supporting projections 22a in a state where the work W is held by the robot hand 1. The work W is released from the robot hand 1 and mounted onto the work mounting part 22, and the carrier plate K of the work W is supported by the supporting projections 22a. A weighing unit 23 is provided to the work mounting part 22 so as to measure weights of the work W and the liquid resin fed on the work W. An amount of dispensing the liquid resin has been stored as the resin data, and the liquid resin can be dispensed with an accuracy of, for example, ±about 3 g with respect to the object value. In this case, actual resin feeding data (e.g., number of a resin feeding unit, number of a syringe, amount of feeding resin, time to start feeding resin, time to complete feeding resin) are stored as operation data of the work W.

In the resin feeding section B, a remaining amount of the liquid resin in the syringe 19 set in the dispensing unit 18 is monitored by measuring the vertical position of the piston 18c so as to automatically exchange the syringe 19. When exchanging the syringe 19 is needed, the used syringe 19 is returned to the syringe holding unit 17, and the new syringe 19, which is filled with the liquid resin, is automatically set in the dispensing unit 18. When all of the syringes 19 held by the syringe holding unit 17 are vacant, a message for prompting to exchange the syringes 19 held by the syringe holding unit 17 is shown in the indicating section J (see FIG. 1), so that an operator can manually exchange the syringes 19. Since the syringes 19 can be exchanged with feeding the resin from the syringe 19 set in the dispensing unit 18, the resin molding machine need not be stopped, so that throughput of the machine can be improved.

The work W, on which the liquid resin has been fed, is sucked and conveyed, from the work mounting part 22 to the press section C, by the robot hand 1. For example, if time to convey the work W from the resin feeding section B to the press section C is long, there is a possibility that the liquid resin absorbs moisture or is heated before setting into the press section C. However, in the present embodiment, the work W can be conveyed, by the articulated robot 2, in a short time. In comparison with a conventional technology, in which the work is moved, by a cylinder unit, along prescribed routes, the conveyance of the present embodiment can be performed in a short and constant programmed time.

Since the two dispensing units 18 and the common syringe holding unit 17 are employed and the syringes 19 are automatically exchanged, the resin can be continuously fed without interruption. The resin feeding section B has the compact structure and is capable of following the molding actions of the pluralities of press sections C which are continuously operated, so that production efficiency can be improved.

In the above described embodiment, the liquid resin is used as the resin. The resin feeding section B can feed other types of resin (e.g., tablet resin, powder resin, granular resin, paste resin, sheet resin) according to types of works or products. In case of using powder or granular resin, a unit for conveying resin may be provided to the robot hand 1, and the resin may be indirectly fed onto the work W. In this case, the robot hand 1 conveys the work W and the resin to the press section C, and the resin contacts and molds the work W after the resin is heated and melted in the press section C, so that quality of the molded product can be improved.

Press Section C

Next, the structure of the press section C will be explained with reference to FIGS. 7A-10.

In the present embodiment, as shown in FIG. 1, the pluralities of press sections C are located on the inner side of the guide rails 4. Number of the press sections C is not limited to two. One press section C, or three or more press sections C may be employed. Note that, in the resin molding machine of the present embodiment, the guide rails 4 may be extended. In this case, number of the processing sections, e.g., the press section C, may be increased without changing the existing structure. In case that moving the articulated robot 2 along the guide rails 4 and actuating the robot hand 1 of the articulated robot 2 are simultaneously performed, the work W can be conveyed rapidly. The press sections C may be used to resin-mold works of same type or different types. Each of the press sections C is divided from the conveying area by a partition wall 24 having an opening 24a. The opening 24a is usually closed by a shutter 25, but the shutter 25 can be actuated to open the opening 24a. The shutter 25 is driven by a driving source, e.g., cylinder unit, solenoid.

In FIG. 7A, the press section C includes a known press unit 26, which has a molding die set capable of clamping and resin-molding the work W. In the press unit 26, an upper die (for example, fixed die) 28 is provided to an upper platen 27, and a lower die (for example, movable die) 30 is provided to a lower platen 29. The work W, which has been set on the lower die 30, is clamped, by the upper die 28 and the lower die 30, so as to compression-mold the work W. Four tie bars 31 are pierced through corners of the upper platen 27 and the lower platen 20 so as to guide the open-close action of the molding die set.

A loader 32, which is capable of reciprocally moving between the press unit 26 and the conveying area 11, is provided in each of the press sections C. A work mounting section 33, which corresponds to each of the press sections C, is located, in front of the opening 24a closed by the shutter 25, in the conveying area 11. The work W, which is sucked and held by the robot hand 1 and on which the liquid resin has been fed, is transferred onto the work mounting section 33, and the molded work W, which has been taken out from the press unit 26 by the loader 32, is transferred onto the work mounting section 33, too.

Rails 34 are extended from the inner space of the press unit 26 to the conveying area 11, including a position above the work mounting section 33, via the opening 24a of the partition wall 24. The loader 32 can be reciprocated between the press unit 26 and the conveying area 11 along the rails 34. The rails 34 are respectively provided on the both sides of the opening 24a so as not to interfere with the open-close action of the shutter 25. The loader 32 stands by at a position above the work mounting section 33, receives the work W from the robot hand 1, conveys the work W into the lower die 30, takes out the molded work W from the lower die 30 and transfers the molded work W onto the work mounting section 33.

In FIG. 7A, a film feeding unit 35 is provided to the upper platen 27, to which the upper die 28 having a cavity is attached, as shown by dotted lines. A long release film 36 (see FIG. 8A), which covers a clamping face of the upper die 28, is extended between reels of the film feeding unit 35 and wound thereon. The release film 36 is sucked and held on the clamping face of the upper die 28 by a known sucking mechanism. The release film 36 has enough heat resistance against heat of the molding die set and can be easily peeled from the clamping face of the upper die 28. The release film 36 is composed of a material having flexibility and extensibility, e.g., PTFE, ETFE, Pet, FEP, glass cloth including fluorine, polypropylene, polyvinylidene chloride.

Next, conveying the work W to and from the press section C and pressing action of the press section C will be explained. In FIG. 7A, the upper die 28 and the lower die 30 of the press unit 26 is opened, and the opening 24a of the partition wall 24 is closed by the shutter 25. The work W, which has been sucked and held by the robot hand 1, is released from the robot hand 1 and received by the work mounting section 33. When the robot hand 1 is moved away, the loader 32 catches the work W, by a hand, and conveyed the work W from the work mounting section 22 to the lower die 30 of the press unit 26 through the opening 24a, which has been opened by the shutter 25, as shown in FIG. 7B. Therefore, the work W can be set in the lower die 30.

Figure 8A:
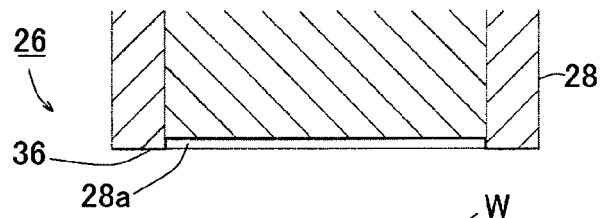
FIGS. 8A-8C are sectional views showing compression molding.
Figure 8B:
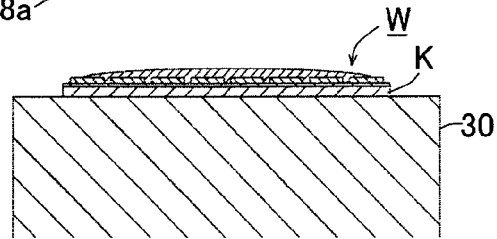

The state where the work W is set in the lower die 30 is shown in FIG. 8A. When the loader 32, which has set the work W, is returned from the press unit 26 to the conveying area 11 through the opening 24a, the opening 24a is closed by the shutter 25 and the press unit 26 clamps the work W to perform compression molding. The lower die 30 is moved upward, so that the work W is clamped between the upper die 28 and the lower die 30 as shown in FIG. 8B. The release film 36 has been sucked and held on the clamping face of the upper die 28 including the cavity 28a.

Figure 8C:
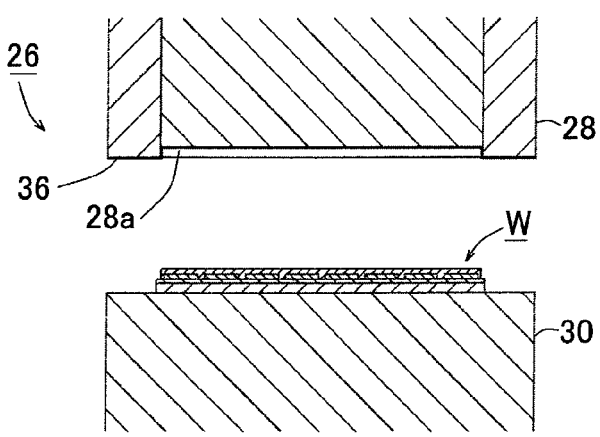

Upon completing the compression molding, the molding die set of the press unit 26 is opened as shown in FIG. 8C, the work W is separated from the upper die 28, on which the release film 36 is sucked and held, and left on the lower die 30. The shutter 25 opens the opening 24a, and then the loader 32 enters the press unit 26 from the conveying area 11. The loader 32 takes out the molded work W from the lower die 30 and transfers the work W to the work mounting section 33 in the conveying area 11 (see FIG. 7A).

Another example of the press unit 26 will be explained with reference to FIGS. 9A-10.

Note that, the structural elements described above are assigned the same symbols and explanation will be omitted. For example, in the E-WLP method, an adhesive tape S is adhered to the carrier plate K of the work W, and semiconductor chips T, which are adhered on the adhesive tape S, are molded with resin. The molded product, in which the semiconductor chips T are molded with resin, is detached from the carrier plate K. The adhesive sheet S is a film having thermal foaming property, so its adhesive force can be reduced by applying heat. Therefore, the molded product can be separated from the carrier plate K after completing the molding action. In the molding process using such the work W, there is a possibility that reduction of the adhesive force of the adhesive sheet S is started, by applying heat, when the work W is directly set on the lower die 30 of the press unit 26. So, the semiconductor chips T will be moved, toward the outer edge of the carrier plate K, by the resin flowing on the carrier plate K. This phenomenon is called "flying die". A bottom face of the work W has a large area, but the molded product is thin. Upon setting the work W in the lower die 30 of the press unit 26, viscosity of liquid resin 80, which is fed to adhesive faces of the semiconductor chips T, is increased by heat conducted from a clamping face of the lower die 30. By the increase of the viscosity, there is a possibility that curing the resin excessively progresses.

Figure 9A:
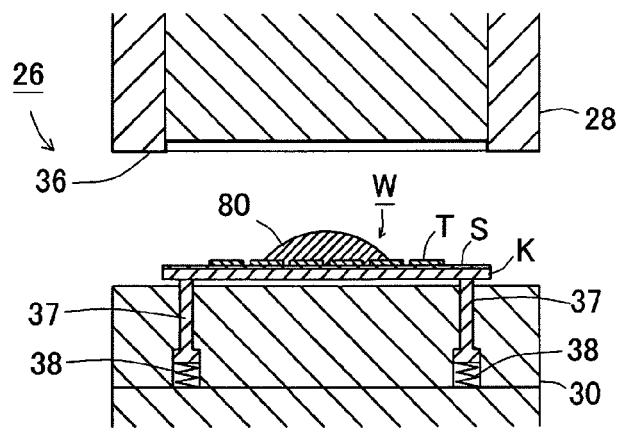
FIGS. 9A-9C are sectional views showing another compression molding.

Thus, as shown in FIG. 9A, float pins 37, which act as the work supporting section, are provided in the lower die 30 so as to separate the work W from the clamping face of the lower die 30 when the work W is conveyed into the press unit 26 and set in the lower die 30, which has been heated about 180° C. The float pins 37 are always biased, by coil springs 38 provided in the lower die 30, so that upper ends of the float pins 37 are projected, from the lower die 30, toward the upper die 28. Preferably, spring modulus of the coil springs 38 is designed that the float pins 37 are not completely retracted into the lower die 30 (a clearance exists between the work W and the clamping face of the lower die 30) when the work W is mounted. Note that, in case that the work W is floating-supported, from the clamping face of the lower die 30, by the float pins 37 as described above, the lower die 30 does not interfere with the hand of the loader 32 and the work W can be caught easily. In this case, preferably, a sucking mechanism for sucking the work W onto the lower die 30 is provided. By sucking the work W onto the lower die 30 when the molding dies 28 and 30 are opened, adhering the work W onto the upper die 28 can be prevented.

Figure 10:
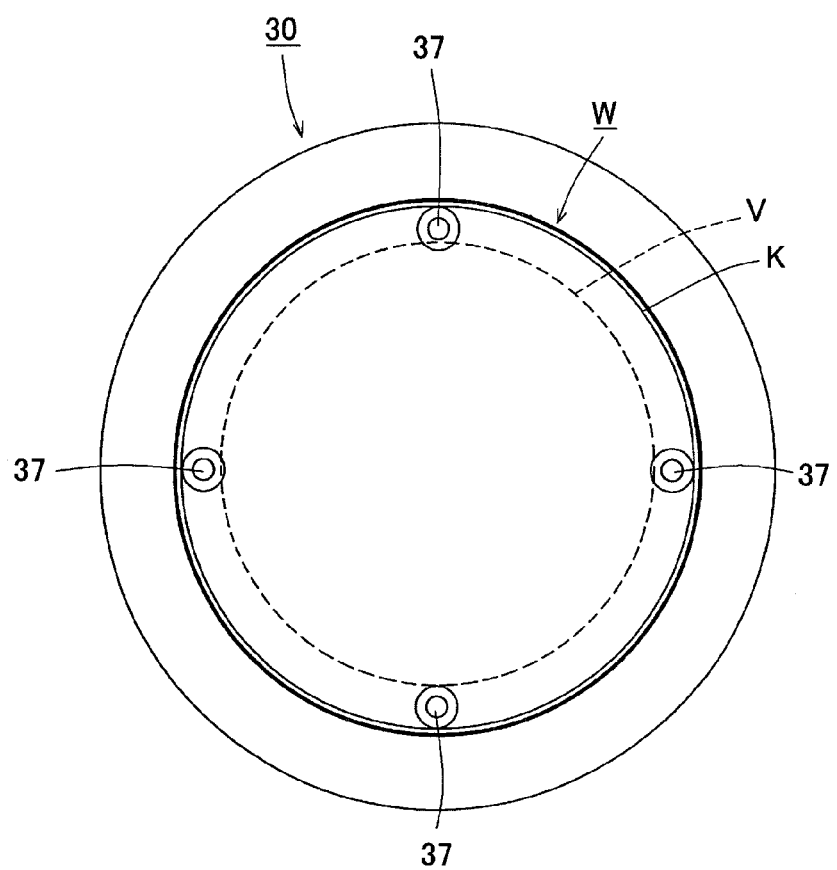
FIG. 10 is a plan view of a work supporting section.

Note that, as shown in FIG. 10, the four float pins 38 are equally separated with angular separation of 90°. The float pins 37 are located outside of a mounting area V of the semiconductor chips T, which is shown by a dotted line in the drawing. With this structure, reduction of the adhesive force of the adhesive sheet S located immediately above the float pins 37, which is caused by the heat conducted by the float pins 37, can be prevented, and bend of the carrier plate K, which is caused when the carrier plate K is clamped between the clamper of the upper die 28 and the float pins 37, can restrained.

Number and arrangement of the float pins 37 may be optionally changed. For example, three float pins may be provided with angular separation of 120°. The shape of the float pins 37 may be optionally designed as far as the heat conduction from the clamping face of the lower die 30 can be restrained. For example, the shape of the float pins 37 may be formed into a rod whose sectional shape is a circle or a rectangle, a pipe, a plate, a frame, etc.

In FIG. 9A, the work W is set in the press unit 26 whose molding dies 28 and 30 are opened. The work W presses the float pins 37 downward but floating-supported in the state where the work W is separated from the clamping face of the lower die 30. Therefore, even if the work W is set in the heated die, it is difficult to conduct the heat from the clamping face to the work W immediately before the liquid resin 80 extends on the adhesive sheet S, so that displacement of the semiconductor chips T and moving the semiconductor chips T together with the flowing liquid resin 80 can be prevented. Concretely, the liquid resin 80 applied onto the carrier plate K outwardly flows and extends from an outer part thereof, so amount of flowing the resin is maximized, in the outer part, when the resin is applied, and the flying die will occur easily. Namely, by heating from the clamping face of the lower die 30, the adhesive force of the adhesive sheet S is reduced and the liquid resin 80, whose viscosity is temporarily reduced, flows toward the semiconductor chips T. Therefore, the flying die will occur easily. The liquid resin 80 is brought into contact with the clamping face of the upper die 28, so that the liquid resin 80 on the upper side, which is separated from the semiconductor chips T, preferentially flows and heating the adhesive sheet S is restrained to prevent the reduction of the adhesive force. Therefore, the flying die can be effectively prevented.

Further, it is difficult to conduct the heat from the clamping face of the lower die 30 to the work W, so that viscosity of the resin whose gel time is short is increased and flowability of the resin is lowered before the resin extends. Therefore, the work W can be perfectly molded and quality of the molded product can be improved.

Figure 9B:
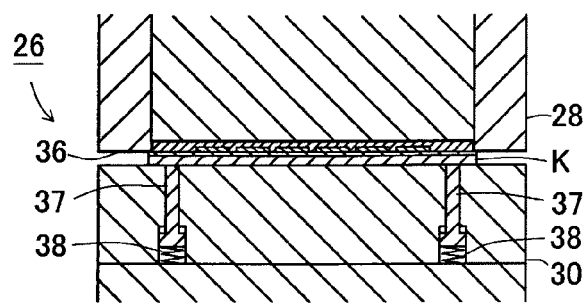

In FIG. 9B, the molding dies 28 and 30 of the press unit 26 are closed. The work W is clamped between the upper die 28 and the lower die 30, and the float pins 37 compress the coil springs 38 to retract the upper ends of the float pins 37 into the lower die 30.

Figure 9C:
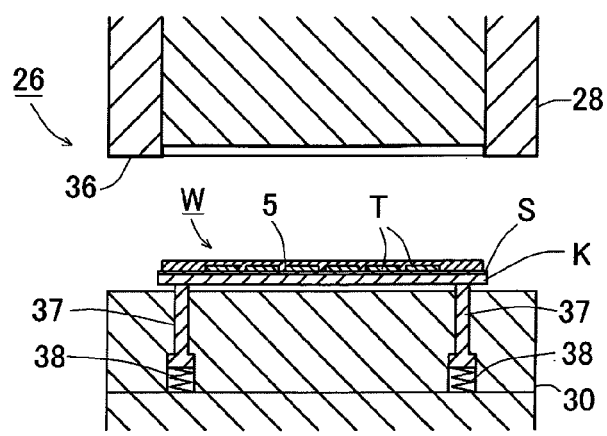

Upon completing the compression molding, the molding dies 28 and 30 of the press unit 26 are opened. In FIG. 9C, the lower die 30 is moved downward, the work W is separated from the molding face of the upper die 28, which is covered with the release film 36, and the upper ends of the float pins 37 are projected from the lower die 30 by spring force of the coil springs 38, so that the work W can be floating-supported with forming the clearance between the work W and the lower die 30. In this state, the shutter 25 is opened, the loader 32 enters the press unit 26 from the conveying area 11, and the loader 32 catches the molded work W from the lower die 30 and conveyed to the conveying area 11 so as to transfer the molded work W to the work mounting section 33 (see FIG. 1). The control section G stores actual molding data, e.g., number of the used press section C, temperature curve of the molding die, clamping-pressure curve, thickness of molded parts, amount of the used release film, in the memory unit 47 as operation data.

Work Examination Section D

Figure 11:
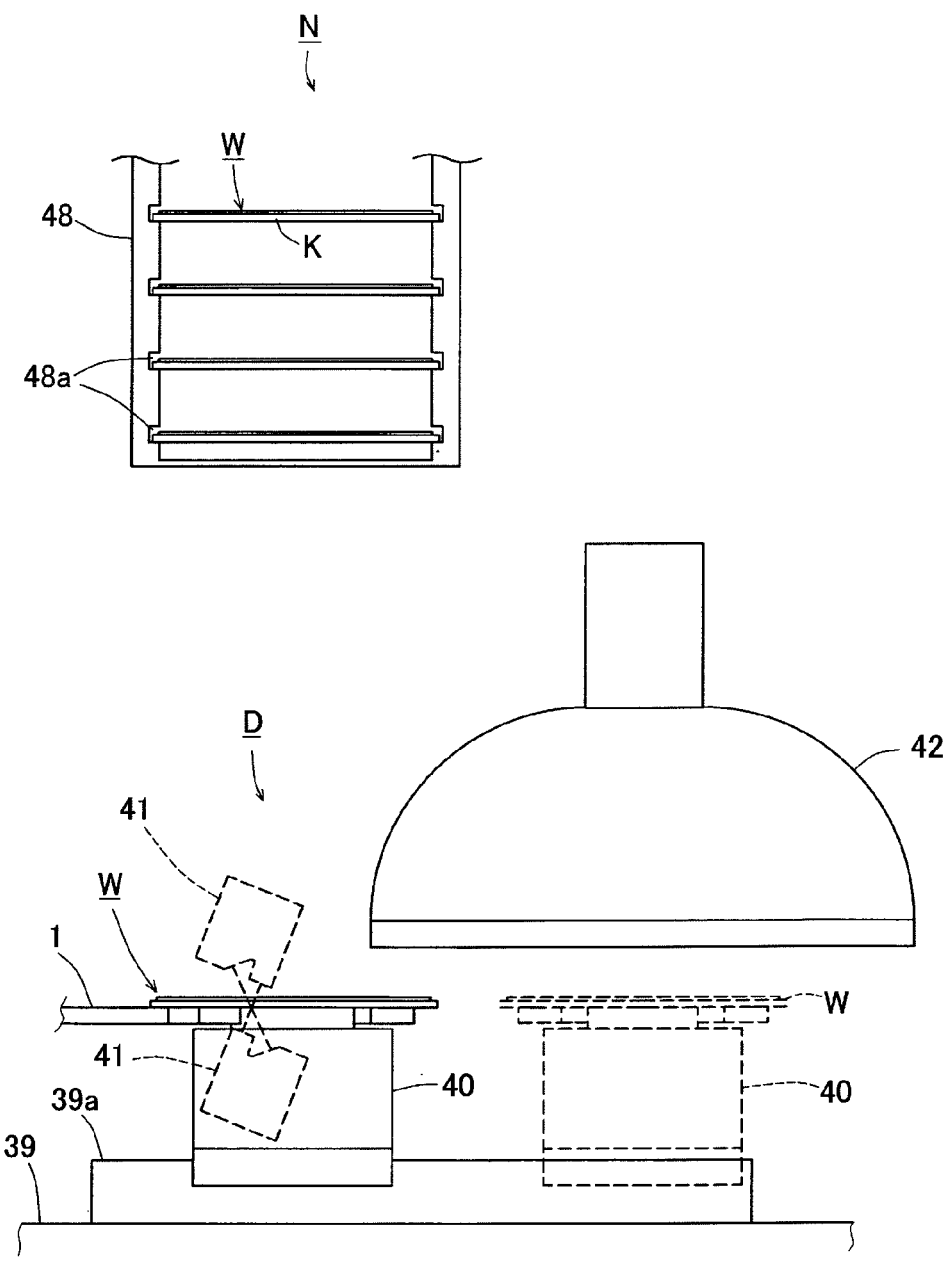
FIG. 11 is an explanation view of a cooling section and a work examination section.

Next, the work examination section D will be explained with reference to FIG. 11. In FIG. 11, a linear rail 39a is provided on a base section 39. A movable stage 40 is capable of reciprocally moving along the rail 39a. The movable stage 40 is driven by a known mechanism. For example, a nut section of the movable stage 40 is screwed with a ball bearing screw, and the ball bearing screw is rotated, in the both direction (i.e., a normal direction and a reverse direction), by a motor, so that the movable stage 40 can be reciprocally moved along the rail 39a.

The movable stage 40 is located at a work receiving position, which corresponds to one end of the rail 39a. The work W, which has been compression-molded in the press section C, is mounted onto the movable stage 40, by the robot hand 1, and the suction is released, so that the work W can be transferred. The work conveying mechanism H has a pair of laser displacement gauges 41, which are respectively located above and under the work W mounted on the movable stage 40 located at the work receiving position. Therefore, a thickness of the work W is measured, by emitting laser beams from the laser displacement gauges 41, before the work W is mounted onto the movable stage 40 by the robot hand 1. The control section G stores the measured thickness as the operation data. In this case, a thickness of the molded product can be obtained by subtracting a thickness of the carrier plate K from that of the work W. The movable stage 40 moves from the one end of the rail 39a to the other end thereof. An external shape examination section 42 is located at a position above the other end of the rail 39a. In the external shape examination section 42, images of the molded products are photographed at a time or respectively so as to examine if faulty points, e.g., insufficient molding, flow mark, flying die, exist or not. Examination results (e.g., good/bad), types of faulty points, photographed images, etc. are stored in the memory unit 47 as the operation data. Upon completing the examination, the movable stage 40, on which the molded work W is mounted, is returned to the work transferring position, and then the work W is transferred to the robot hand 1 and conveyed to the thermally-curing section E.

Note that, if a faulty point, e.g, excessively insufficient molding, is detected, the result is shown by the indicating section J, the entire molding machine is stopped to perfume maintenance, so that producing bad products can be prevented.

Thermally-Curing Section E

Figure 12A:
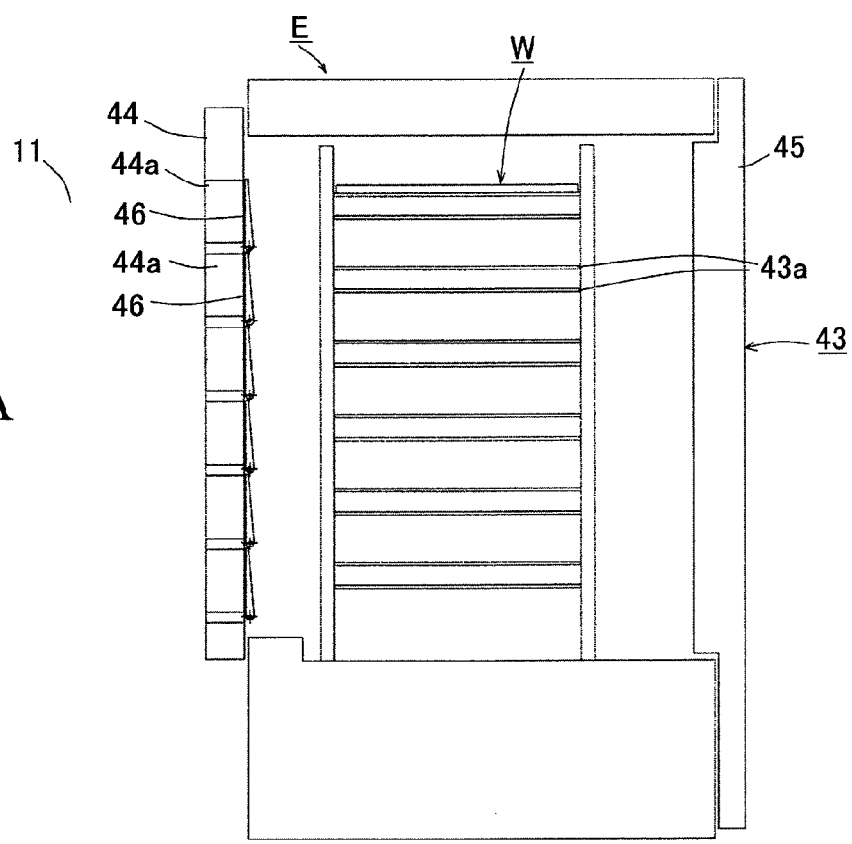
FIGS. 12A and 12B are explanation views showing opening and closing actions of a shutter of a thermally-curing section and a state of accommodating the work.

Next, the thermally-curing section E will be explained with reference to FIGS. 12A and 12B. The thermally-curing section E includes a curing furnace 43. The examined works W are accommodated in the curing furnace 43, by the robot hand 1, so as to thermally cure (post-cure) the resin at about 120-150° C. In FIG. 12A, pairs of slits 43a are formed, in the side faces of the curing furnace 43, and arranged in the vertical direction at regular separations. The works W can be accommodated in the curing furnace 43 and vertically arranged with the regular separations. To accommodate the works W in the curing furnace 43, each of the works W is inserted therein along the pair of the slits 43a facing each other.

As shown in FIG. 1, an inner door 44 is respectively provided to a side wall of the curing furnace 43, which faces the conveying area 11. An outer door 45 is respectively provided to a side wall of the curing furnace 43, which faces outside of the resin molding machine. As shown in FIG. 12A, the inner door 44 has pluralities of openings 44a, each of which corresponds to the pairs of slits 43a vertically arranged. The openings 44a are respectively opened and closed by open-close doors 46. The open-close doors 46 usually close the openings 44a. As shown in FIGS. 1 and 12A, two spaces, each of which includes 12 pairs of the slits 43a, are formed in the curing furnace 43, so the cueing furnace 43 can post-cure 24 works W simultaneously.

In the present embodiment, if time between completing the resin molding in the press section C and starting the post cure is long, there is a possibility that the resin-molded part of the work W bends. However, the work W can be smoothly conveyed, in the vertical direction, by the articulated robot 2, so that the work W can be smoothly moved to any pair of slits 34a located at any heights for a short time. In case that the conveying time influences quality of the molded products, the effect of shortening the conveying time, by employing the articulated robot 2, is great.

Figure 12B:
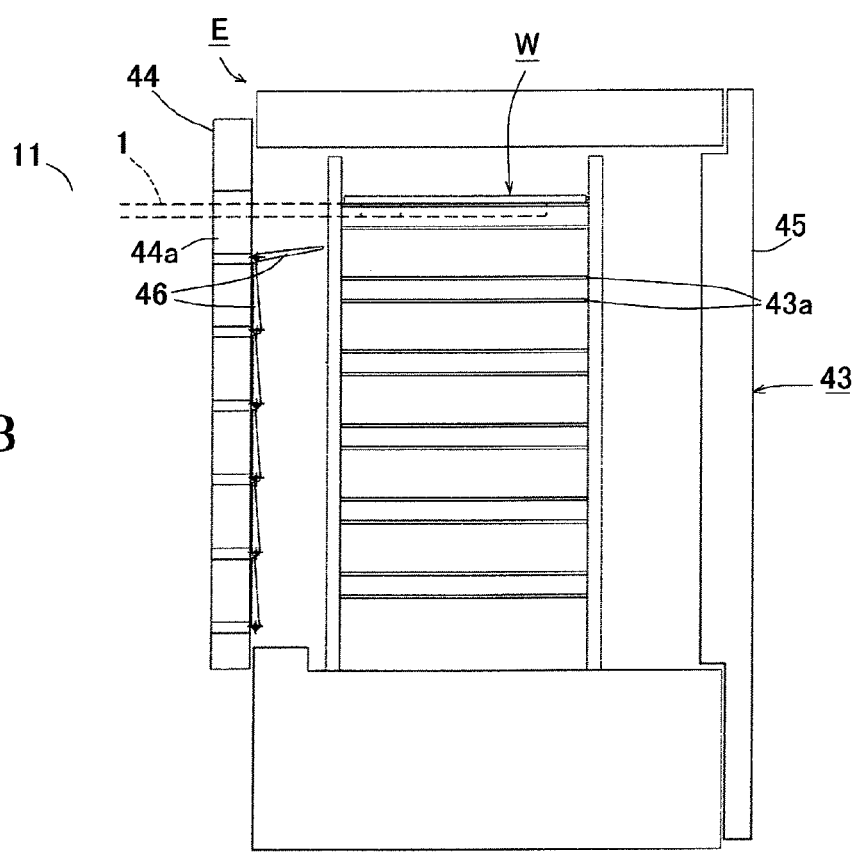

As shown in FIG. 12B, by opening one of the open-close doors 46, the robot hand 1 is capable of inserting the two works W into the slits 34a. Namely, the two works W can be vertically arranged and accommodated. By respectively actuating the open-close doors 46, the works W can be inserted and taken out through the respective openings 44a having small area, so that temperature reduction of the curing furnace 43 and heat radiation toward the conveying area 11 can be prevented.

The work W examined in the work examination section D is sucked and conveyed to the curing furnace 43 by the robot hand 1. As shown in FIG. 12A, the open-close doors 46 close the openings 44a, and the curing furnace 43 is heated at a prescribed temperature. For example, in case of inserting the work W into the uppermost slits 43a, the control section G controls a driving mechanism (not shown) so as to open the uppermost open-close door 46, which corresponds to the uppermost slits 43a, when the robot hand 1 approaches to the inner door 44 (see FIG. 12B). Next, the robot hand 1 enters the curing furnace 43 and inserts the work W in the uppermost slits 43a. The robot hand 1 release the suction to transfer the work W to the curing furnace 43, and then the robot hand 1 evacuates from the curing furnace 43. When the robot hand 1 leaves from the inner door 44, the open-close door is closed. The above described actions are repeatedly performed. After a prescribed time lapsed, the robot hand 1 enters the curing furnace 43 again to suck and hold the cured work W, then the robot hand 1 takes out the work W from the curing furnace 43 and conveys it to the cooling section N.

Cooling Section N

As shown in FIG. 11, the cooling section N includes a cooling magazine 48, which is located above the work examination section D. Pairs of slits 48a are formed, in the both side faces of the cooling magazine 48, at regular separations in the vertical direction. The works W can be accommodated in the cooling magazine 48 and vertically arranged with the regular separations. To accommodate the work W in the cooling magazine 48, each of the works W is inserted therein along the pair of the slits 48a facing each other. The articulated robot 2 is capable of moving to optional vertical positions, so the works W can be inserted into the optional pairs of slits 48a. The work W, whose resin-molded part has been thermally cured, is sucked and conveyed to the pair of slits 48a (transferring position), by the robot hand 1. And then, the suction is released to transfer the work W to the slits. The work W is left in the cooling section N for a prescribed time, so that the work W is naturally cooled. Note that, the cooling section N may be separated from the work examination section D, but the resin molding machine can be downsized by using the vacant space above the work examination section D.

Work Accommodating Section F

As described above, the structure of the work accommodating section F is the same as that of the work feeding section A. The robot hand 1 takes the work W, which has been cooled in the cooling section N, and conveyed to the adjacent work accommodating magazine 10 so as to accommodate therein.

Control Section G

As shown in FIG. 1, the control section G has a CPU and the memory unit 47, e.g., ROM, RAM, so as to control the above described sections. Control programs, lists of works W to be conveyed, conveying order, code data attached to works W are stored in the memory unit 47. The CPU reads required programs from the ROM and writes them in the RAM to execute the programs, temporarily stores inputted data in the RAM, processes the inputted data and outputs commands on the basis of the control programs.

Data including operation data of the work feeding section A (e.g., slit numbers of using slits of the work feeding magazine), operation data of the code reading unit 16 (e.g., recipe data, resin conditions, molding conditions, curing conditions, cooling conditions), data of the resin feeding section B (e.g., syringe numbers; (types of resin, thawing time and total amount of storing resin), amount of use resin (for each feeding action/total amount), time of starting feeding actions/time of completing the feeding actions), operation data of the press sections C (e.g., temperature curves of the molding die sets, clamping pressure curves, thicknesses of molded products, amount of used release films), operation data of the curing furnace 43 (e.g., temperature of the furnace), operation data of the work examination section (e.g., flying die, thicknesses of molded products), operation data of the work accommodating section F (e.g., positions of using slits), etc. are inputted to the control section G any time, and the control section G outputs required commands. The control section G makes the above described operation data and molding conditions correlate with each of the works W and stores them. Therefore, actual production conditions of the molded works W can be known. For example, the molding conditions and operation data can be confirmed by reading the data code of the carrier plate K of the molded work W. Since the actual data relating to the molded products can be easily known, they can be used to optimize the molding conditions.

Note that, in the present embodiment, the control section G is placed to enclose the work conveying mechanism H with other processing sections, but the control section G may remote-control the processing sections by radio or communication lines.

Figure 13:
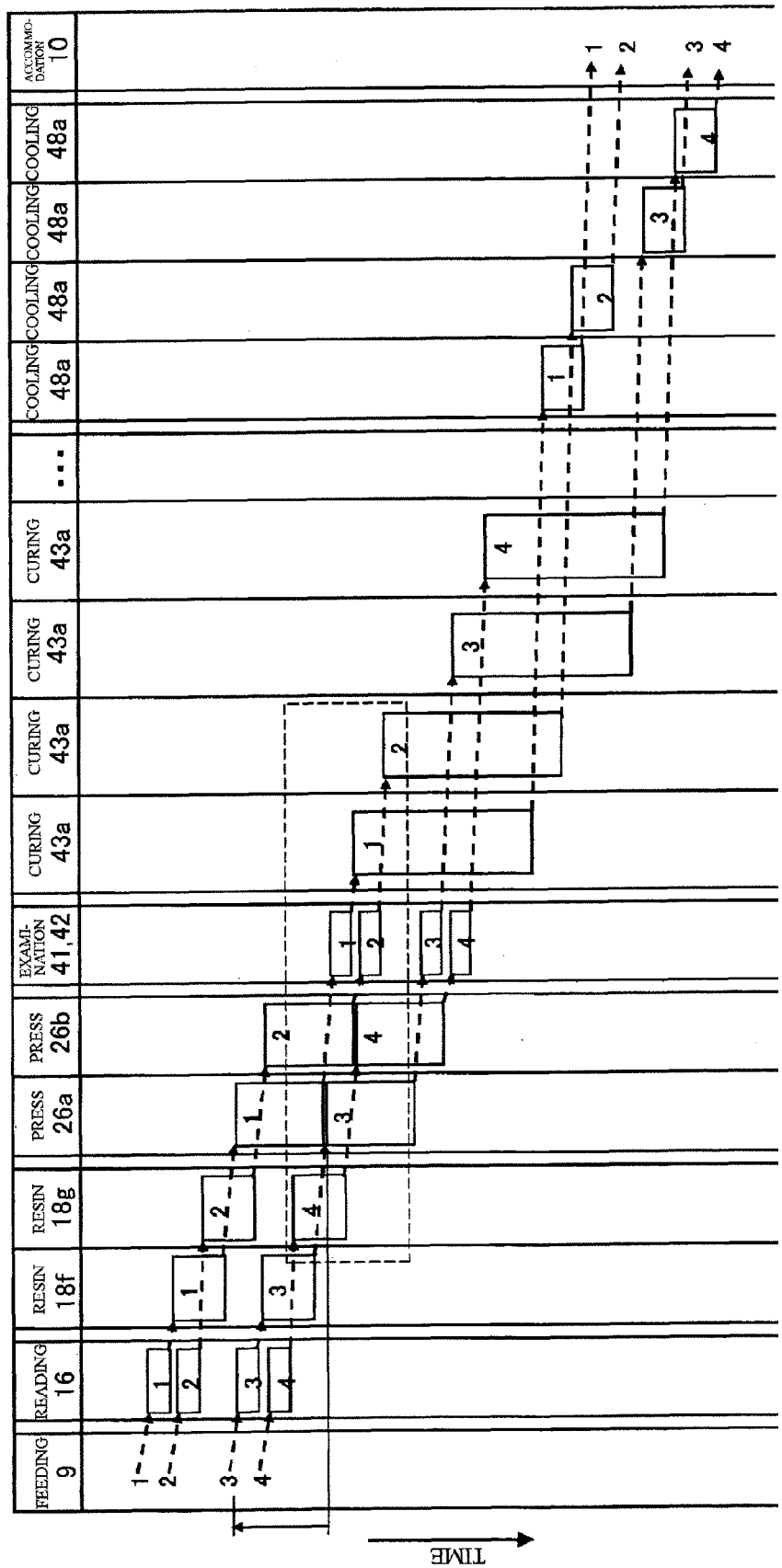
FIG. 13 is a timing chart showing timing of a work conveying mechanism which feeds the work to the press section.

FIG. 13 is an example of timing charts of the resin molding machine, in which four works W (W1-W4) are sequentially fed from the feeding magazine and accommodated in the accommodating magazine. Two dispensing units 18f and 18g and two press units 26a and 26b are used. Number of the slits 43a of the curing furnace 43 is 24, and number of the slits 48a of the cooling magazine 48 on the cooling section N is four. In this example, a cycle time of each of the processing sections obtained by dividing a required processing time of each processing section by maximum number of the processable works (e.g., number of units, number of slits). In the thermal curing section E whose required processing time is relatively long, number of the slits 43a is increased so as to increase number of the works to be cured simultaneously. Therefore, the processing action is not delayed in the thermal curing section E.

However, cycle times of the processing sections cannot be equalized. Thus, timing of feeding the work W to and taking out the work W from the processing sections except the specific processing section whose processing time is longest are controlled on the basis of timing of feeding the work W to and taking out the work W from the specific processing section. In FIG. 13, the processing cycle of the press units 26a and 26b are longest, so timing of taking out the work W3 from the work feeding section A is set by back calculation. In this case, timing of conveying each of the works W1-W4 is designed so as to eliminate wasting time while resin-molding the works W1 and W3 in the press unit 26a and while resin-molding the works W2 and W4 in the press unit 26b. Concretely, when resin-molding the work W1 in the press unit 26a is completed, the next work W3 is fed into the vacant press unit 26a. The timing of feeding the work W3 is defined by back calculation. FIG. 14A is a table showing work conveying order of a rectangular part of FIG. 13, which is indicated by dotted lines. According to the table, when the work No. 1 is conveyed from the press unit 26a to the work examination section D, the next work No. 3 is conveyed from the dispensing unit 18f to the press unit 26a, and the examined work No. 1 is conveyed into the curing furnace 43.

Similarly, when the work No. 2 is conveyed from the press unit 26b to the work examination section D (i.e., the laser displacement gauge 41 and the external shape examination section 43), the next work No. 4 is conveyed from the dispensing unit 18g to the press unit 26b, and the examined work No. 2 is conveyed into the curing furnace 43. As described above, the pluralities of works are simultaneously processed and waiting time for conveying the works are minimized, so that the entire resin molding machine can resin-mold the works efficiently.

FIG. 14B shows an example of priority tables, which is stored in the memory unit 47 and shows high-priority processes. Conveying order of the works W conveyed by the articulated robot 2 is controlled on the basis of the priority tables. By previously assigning the priorities of conveying the works W conveyed by the articulated robot 2 as shown in FIG. 14B, order of conveying the work W may be changed according to the priorities when the duration of time before starting to convey the work W is short. Therefore, by considering the priorities, the work W, which has been assigned high-priority and should be conveyed as soon as possible, is firstly conveyed, so that quality of the work W can be improved.

FIG. 14C shows an example of order tables, which shows change of the conveying order. FIG. 14C shows an example of changing order of conveying the work W from the resin feeding section B to the press section C after the work W is conveyed from the cooling section N to the work accommodating section F. The action of conveying the work W from the cooling section N to the work accommodating section F, whose priority is low and which may be conveyed any time and will not influence quality of the molded product, is postponed, so that quality of the molded products can be improved with improving processing efficiency of the entire resin molding machine. Note that, priority of changing the conveying order may be previously programmed and changed by inputting commands.

As described above, the conveying order of the works W is defined on the basis of the processing cycles and the conveying priorities, so that the conveying actions of the work conveying mechanism H can be accelerated and made more efficient according to the molding action performed in the press section C. Further, the work feeding action and the work take-out action follow the molding action so as to improve operating efficiencies of the press units of the press section C. In case that operation of a part of the processing sections should be stopped for maintenance, etc., maximum number of simultaneous processing in each of the processing sections may be changed so as to change the processing cycle time. Therefore, the conveying order may be changed on the basis of the changed processing cycle time. In case of trouble or maintenance, the resin molding can be continued without setting complex processes.

Figure 15:
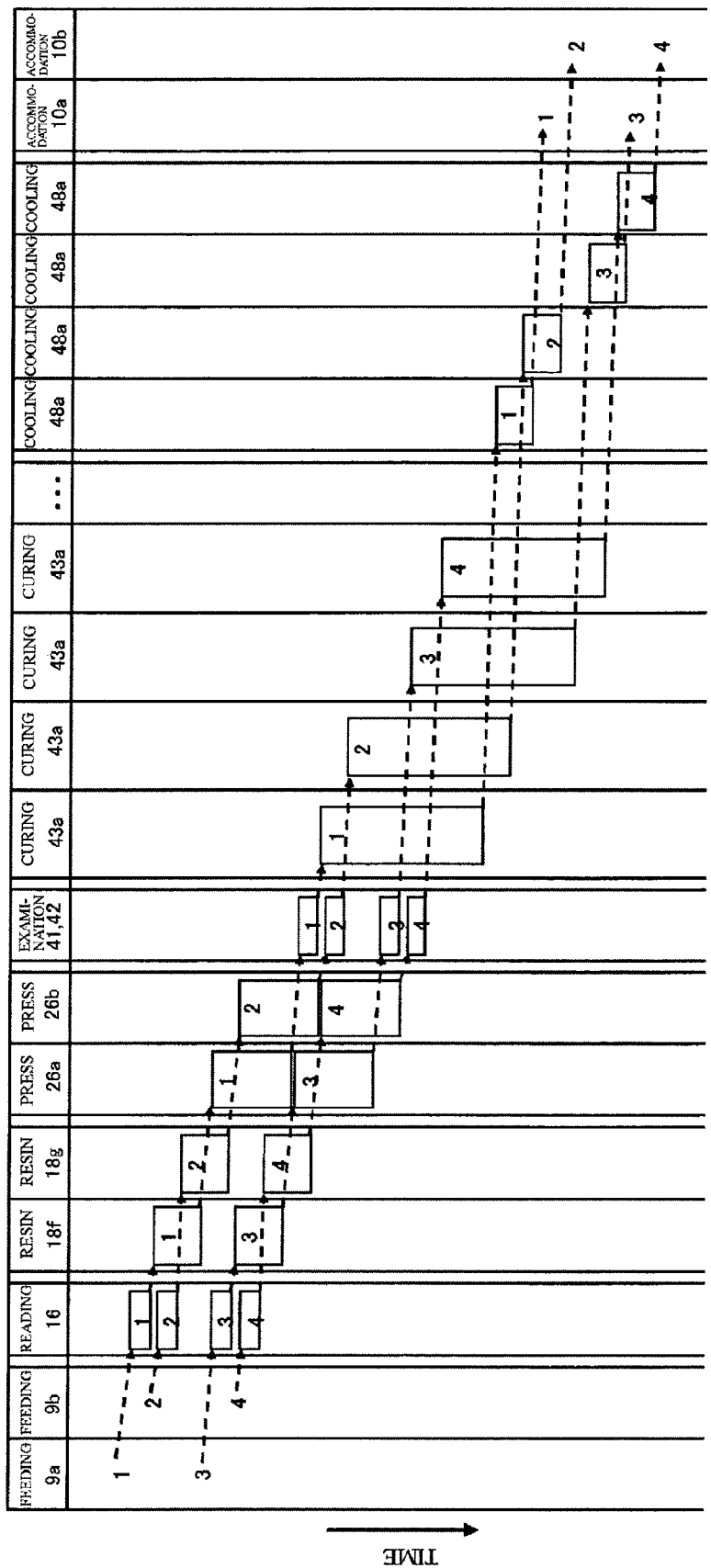
FIG. 15 is a timing chart showing timing of a work conveying mechanism for conveying the work.

FIG. 15 is a timing chart of another example of conveying the works. Unlike FIG. 13, the works W1-W4 are alternately fed from the work feeding magazines 9a and 9b and alternately accommodated into the work accommodating magazines 10a and 10b. In this case, pluralities of types of resin (e.g., two types of resin) may be fed to pluralities of types of works, and pluralities of types of works may be selectively fed to pluralities of types of molding die sets of the press section C. In this example too, the two dispensing units 18f and 18g and the two press units 26a and 26b are used, and the curing furnace 43 has 24 slits 43a.

In this example, pluralities of the syringes 19, in which different types of liquid resin are respectively stored, are attached to the syringe holding units 17, and pluralities of the syringes 19 are selectively fed to the dispensing units 18f and 18g. With this structure, pluralities of types of the liquid resin can be simultaneously fed from the dispensing units 18f and 18g, so that mix production, in which pluralities of types of products are produced with using pluralities of types of resin, can be performed. Different molding die sets are respectively provided in the press units 26a and 26b, and the works W are selectively fed from each of the work feeding magazines 9a and 9b to the press units 26a and 26b. Therefore, the resin molding can be simultaneously performed in the pluralities of types of molding die sets, so that mix production, in which pluralities of types of products are produced with using pluralities of types of resin, can be performed.

Further, thicknesses of resin-molded parts can be changed according to types of resin, and amount of feeding resin can be changed according to types of molding die sets, so molding actions under pluralities of conditions can be performed simultaneously. In the resin molding machine of the present embodiment, product data can be obtained by reading the data code attached to the carrier plate K of each of the works W, and the works W are processed, in the processing sections, on the basis of the product data. Further, processing order of the processing sections can be changed. So, assigning the processing action of each of the processing sections and changing the processing actions when trouble occurs are not required, so that waiting time can be eliminated and production efficiency of the resin molding machine can be improved.

By employing the resin molding machine of the present embodiment, the sequential processing actions, including feeding the work W and the resin, resin-molding the work W, examining the molded work W, post-curing the molded work W and accommodating the molded work W, can be efficiently performed, by the compact structure, under specs of products.

In the above described resin molding machine, the two dispensing units 18f and 18g are provided in the resin feeding section B, and the two press units 26a and 26b are provided in the press section C, but number of the units may be increased. Number of the articulated robot 2 of the work conveying mechanism H is not limited to one, so pluralities of articulated robots may be used to convey the works W in divided conveying areas.

The press unit 26 is not limited to the compression molding unit. For example, the press unit 26 may be a transfer molding unit or a molding unit which produces a decompressed die space and resin-molds a work in the decompressed die space.

The works W to be molded and the molded works W may be stored in one magazine. Namely, the magazine acts as the work feeding section A and the work accommodating section F. In this case, preferably, the molded works W are accommodated in the magazine after the cooling process so as to prevent the works W to be molded from being heated by the molded works W.

Next, another press unit 26 will be explained with reference to FIGS. 16A-18. Note that, the structural elements described above are assigned the same symbols and explanation will be omitted.

In the shown press unit 26, a decompressed die space (negative pressure die space) is produced in the molding die set, and compression resin-molding is performed therein.

Figure 16A:
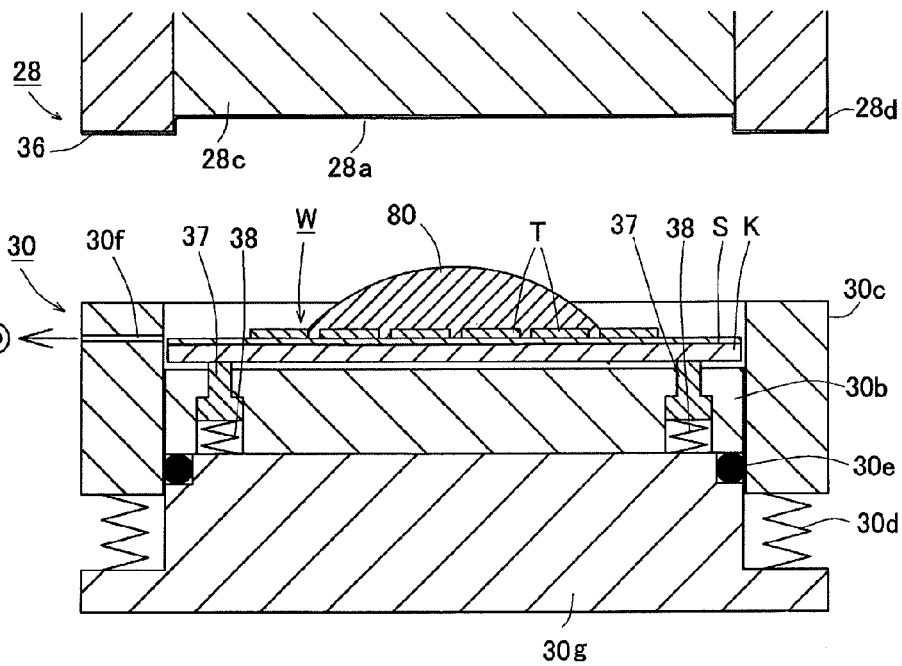
FIGS. 16A and 16B are explanation views showing further embodiment of the press section performing compression molding.

In FIG. 16A, the upper die 28 includes an upper clamper 28d, which encloses a heat upper cavity piece 28c and whose lower end face is located under a lower face of the upper cavity piece 28c. A concave formed by the upper cavity piece 28c and the upper clamper 28d is an upper cavity 28a. The upper clamper 28d is suspended, in an upper base (not shown), by springs. Therefore, the upper clamper 28d is capable of moving upward and downward with respect to the upper cavity piece 28c. Note that, the upper cavity piece 28c may be suspended, in the upper base (not shown), by springs, and the upper cavity piece 28c may apply pressure to resin. The cavity piece 28c may be moved downward by a wedge mechanism. The release film 36 is sucked and held on the clamping face of the upper die 28, which includes the upper cavity 28a.

The lower die 30 includes a lower base 30g and a lower cavity piece 30b, which is mounted on the lower base 30g. In the lower cavity piece 30b, the float pins 37 are always biased to project from the clamping face of the lower die 30 by the coil springs 38. A lower clamper 30c, which encloses the lower cavity piece 30b, is floating-supported, by springs 30d, in the lower base 30g. A gap between the lower base 30g, on which the lower clamper 30c slides, and the lower cavity piece 30b is sealed by an O-ring 30e. A sucking hole 30f, which is communicated to a work mounting section of the lower die 30, is formed in the lower clamper 30c. The sucking hole 30f is connected to a vacuum suction unit.

As shown in FIG. 16A, the work W includes the carrier plate K, on which the semiconductor chips T are adhered by the adhesive sheet S. The liquid resin 80 is fed onto a semiconductor chip holding face of the carrier plate K, on which the semiconductor chips T are adhered. In this state, the work W is mounted onto the clamping face of the opened lower die 30. At that time, the float pins 37 are projected from the clamping face of the lower die 30, the work W is floating-supported and separated from the clamping face of the lower die 30 heated by a heater (not shown). The release film 36 is sucked and held on the clamping face of the upper die 28 including the upper cavity 28a.

Figure 16B:
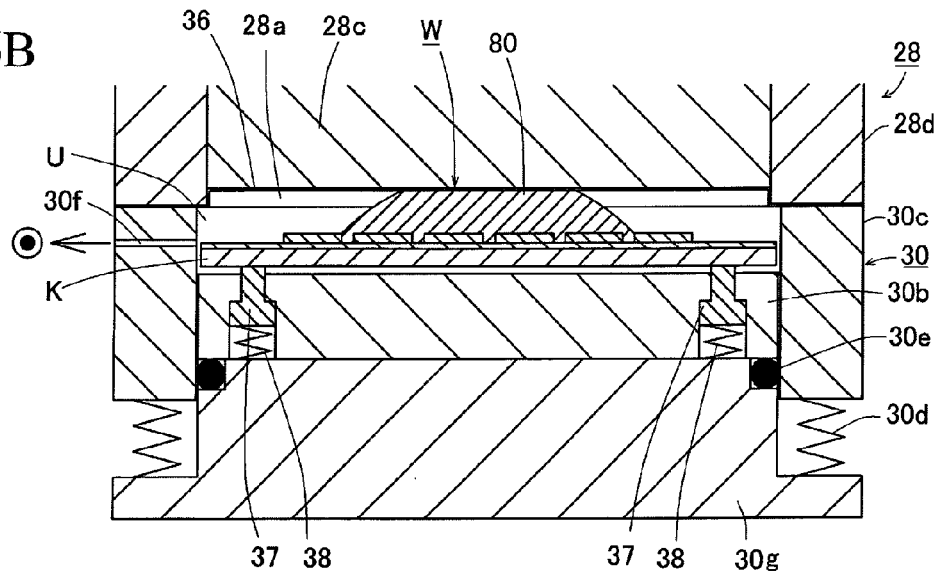

Next, as shown in FIG. 16B, the lower die 30 moved upward to close the molding die set. Firstly, the lower clamper 30c contacts the upper clamper 28d, so that a die space U is formed, and then the die space U is decompressed by the vacuum suction unit (not shown), so that the decompressed space (negative pressure space) can be produced.

Figure 17A:
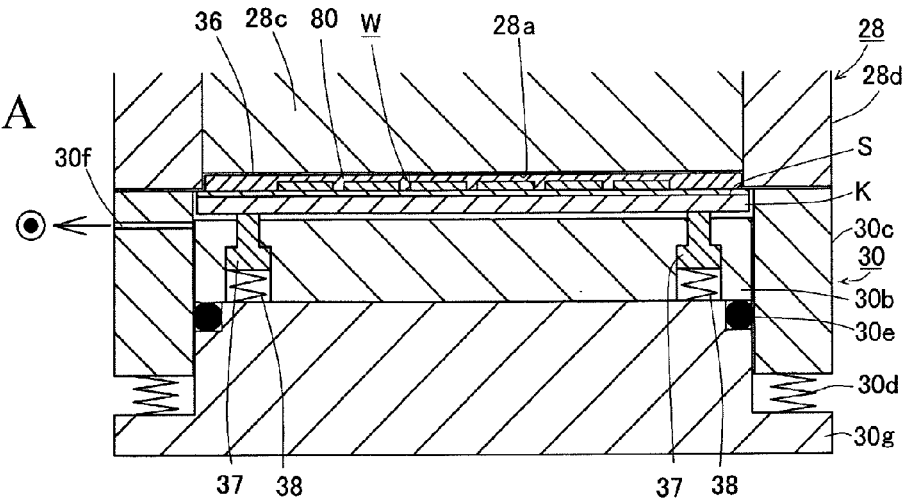
FIGS. 17A and 17B are explanation views showing further embodiment of the press section performing compression molding.

Next, as shown in FIG. 17A, the lower die 30 is further moved upward, so that the upper clamper 28d clamps the work W (the adhesive sheet S and the carrier plate K) and the upper cavity 28a is filled with the liquid resin 80. The liquid resin 80 is directly heated by heat from the upper cavity piece 28c, so that the resin can flow easily and filling the cavity with the resin can be accelerated. However, directly-heating the adhesive sheet S can be restrained.

Figure 17B:
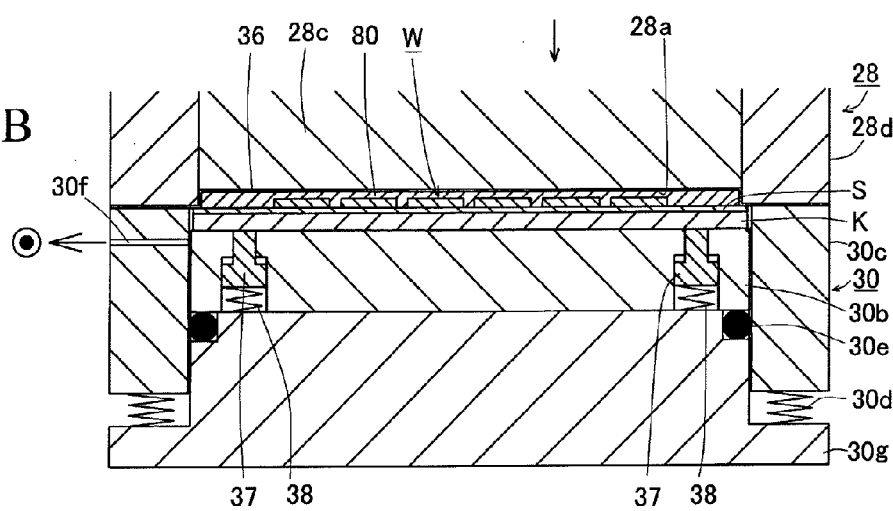

Next, as shown in FIG. 17B, the upper cavity piece 28c is slightly moved downward, by an actuator (not shown), in a direction indicated by an arrow, so as to apply final pressure to the resin. By this action, the work W can be compression-molded. In the molding process, the adhesive sheet S is heated by heat from the lower cavity piece 30b, but the resin does not move. Therefore, no semiconductor chips T are moved by the flowing resin 80. At that time, the upper ends of the float pins 37 are retracted into the lower cavity piece 30b, so the work W is clamped by the upper cavity piece 28c and the lower cavity piece 30b. Therefore, the resin can perfectly fill the cavity and air included in the resin can be purged.

Figure 18:
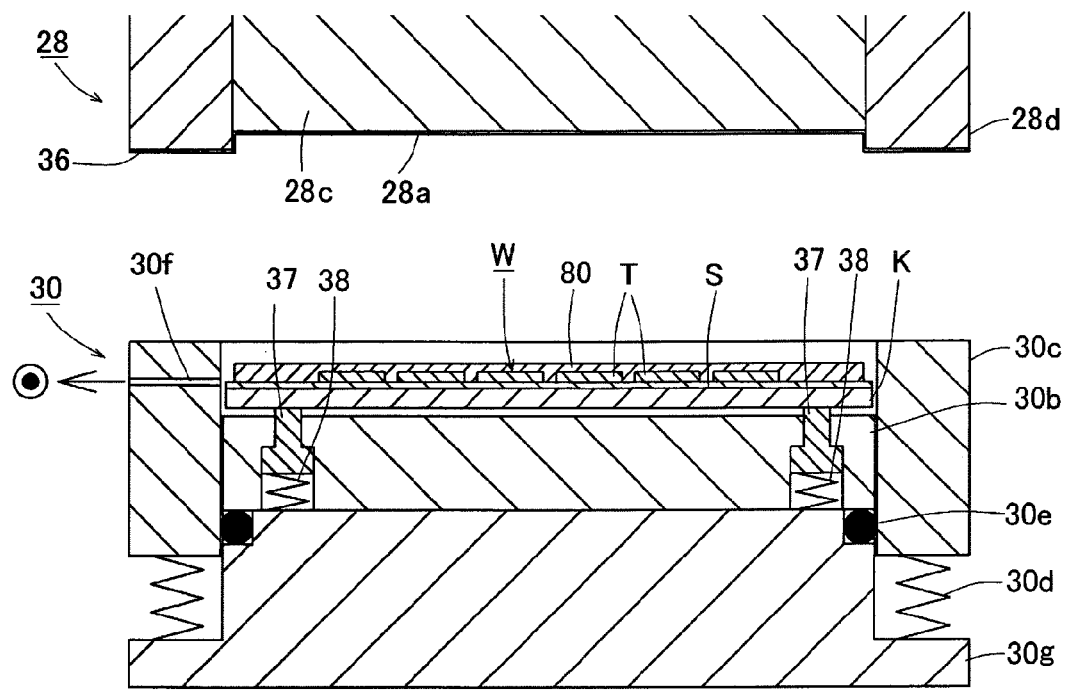
FIG. 18 is explanation views showing further embodiment of the press section performing compression molding.

Upon completing the compression molding, the vacuum suction unit is turned off, and the lower die 30 is moved downward so as to open the molding die set. As shown in FIG. 18, the resin is separated from the release film 36, and the work W is supported by the float pins 37, which are projected from the clamping face of the lower die 30. The work W is conveyed, by the loader 32, from the lower die 30 to the work mounting section in the conveying area 11. And then, the work W is sucked and held by the robot hand 1 and conveyed to the work examination section. By producing the decompressed die space in the clamping state of the molding die set, air included in the resin flowing on the work W having a large resin flow area can be purged, so that quality of the molded product can be improved.

Note that, the carrier plate K is clamped by the upper clamper 28d and the lower cavity piece 30b, and the molding die set is closed with heating the carrier plate K by the lower cavity piece 30b. Therefore, the upper cavity piece 28c can be relatively moved downward. In this case too, the carrier plate K is not directly mounted on the lower cavity piece 30b, so that directly-heating the adhesive sheet S can be prevented. Therefore, if flowing the liquid resin 80 is completed before reducing the adhesive force of the adhesive sheet S, moving the semiconductor chips T by the flowing resin can be prevented.

Figure 19:
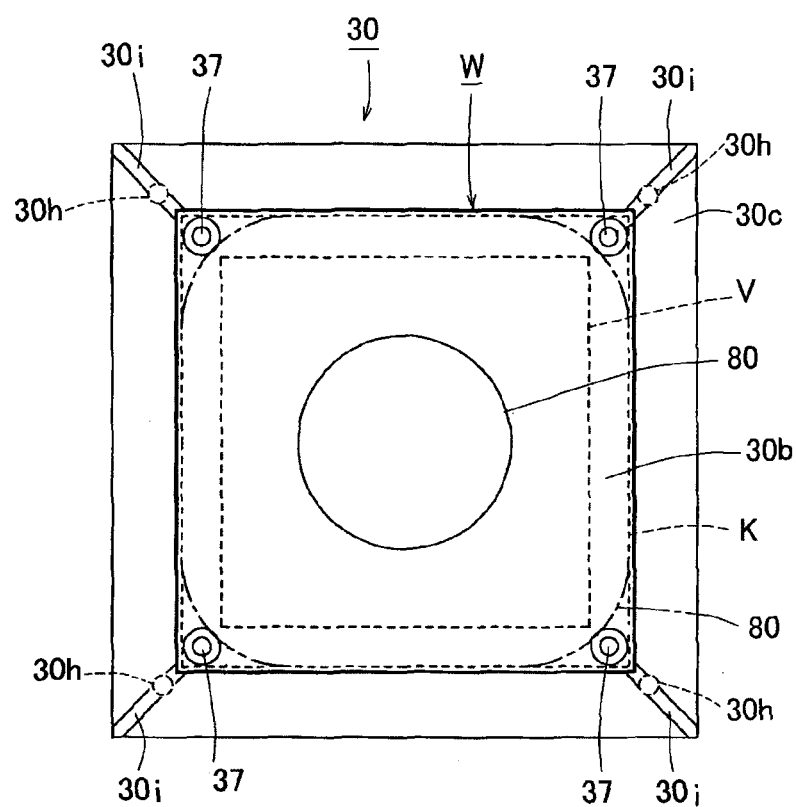
FIG. 19 is a plan view of another work supporting section.

Another example of the carrier plate K is shown in FIG. 19. The shape of the carrier plate K is not limited to the circular shape shown in FIG. 10. For example, a rectangular carrier plate K (e.g., a square carrier plate K), which is shown in FIG. 19 by dotted lines, may be used.

FIG. 19 is a plan view of the lower die 30, on which the work W including the carrier plate K is mounted. The lower cavity piece 30b and the lower clamper 30c enclosing the lower cavity piece 30b, which constitute the lower cavity, are formed into rectangular shapes. Air vent grooves 30i are radially formed at four corners of the clamping face of the lower clamper 30c. The floating pins 37 are floating-supported by the coil springs (not shown) and located near corners of the lower cavity piece 30b. The float pins 37 are located outside of a semiconductor chip mounting area V of the work W.

The liquid resin 80 is firstly heaped in a center part of the work W but radially extended by closing the molding die set. To reduce amount of flowing the liquid resin 80, the liquid resin 80 may be applied, along the rectangular cavity, by a writing-dispensing unit. Note that, the shapes of the carrier plate K, the lower cavity piece 30b and the lower clamper 30c enclosing the lower cavity piece 30b are not limited to the rectangular shapes. They may be formed into polygonal shapes, distorted circular shapes, etc.

In case of that the air vent grooves 30i, which are formed in the rectangular carrier plate K, are required, air vent pins 30h may be used so as not to form resin fins in the air vent grooves 30i. For example, the air vent pins 30h are provided in the upper die 28 and biased, by coil springs, to move with respect to the clamper. Note that, lower ends of the air vent pins 30h may be projected, from the clamping face of the clamper, according to degree of opening the molding die set, so as to close the air vent grooves 30i. In this case, preferably, the positions of the lower ends of the air vent pins 30h are adjusted to close the air vent grooves 30i when the liquid resin 80 is extended by closing the molding die set and frond ends of the flowing resin 80 reach positions short of the air vent grooves 30i. With this structure, insufficiently-filling resin can be prevented.

The air vent pins 30h may be provided in the lower die 30 according to the structure of the molding die set. Further, the air vent pins 30h may be provided in both of the upper die 28 and the lower die 30. Degree of projecting the air vent pins 30h may be adjusted by an actuator, e.g., pneumatic cylinder unit, servo motor, instead of the coil springs. The float pins 37 may be retracted into the lower cavity piece 30b after the air vent pins 30h close the air vent grooves 30i.

In the present embodiment, heat conduction to the work W, which has been set in the molding die set, can be delayed, so that reduction of the adhesive force of the adhesive sheet S, on which the semiconductor chips T are adhered, can be prevented. Flowability of the resin can be maintained with restraining increase of viscosity of the resin fed onto the semiconductor chip holding face, so that quality of the molded product can be improved.

Figure 20:
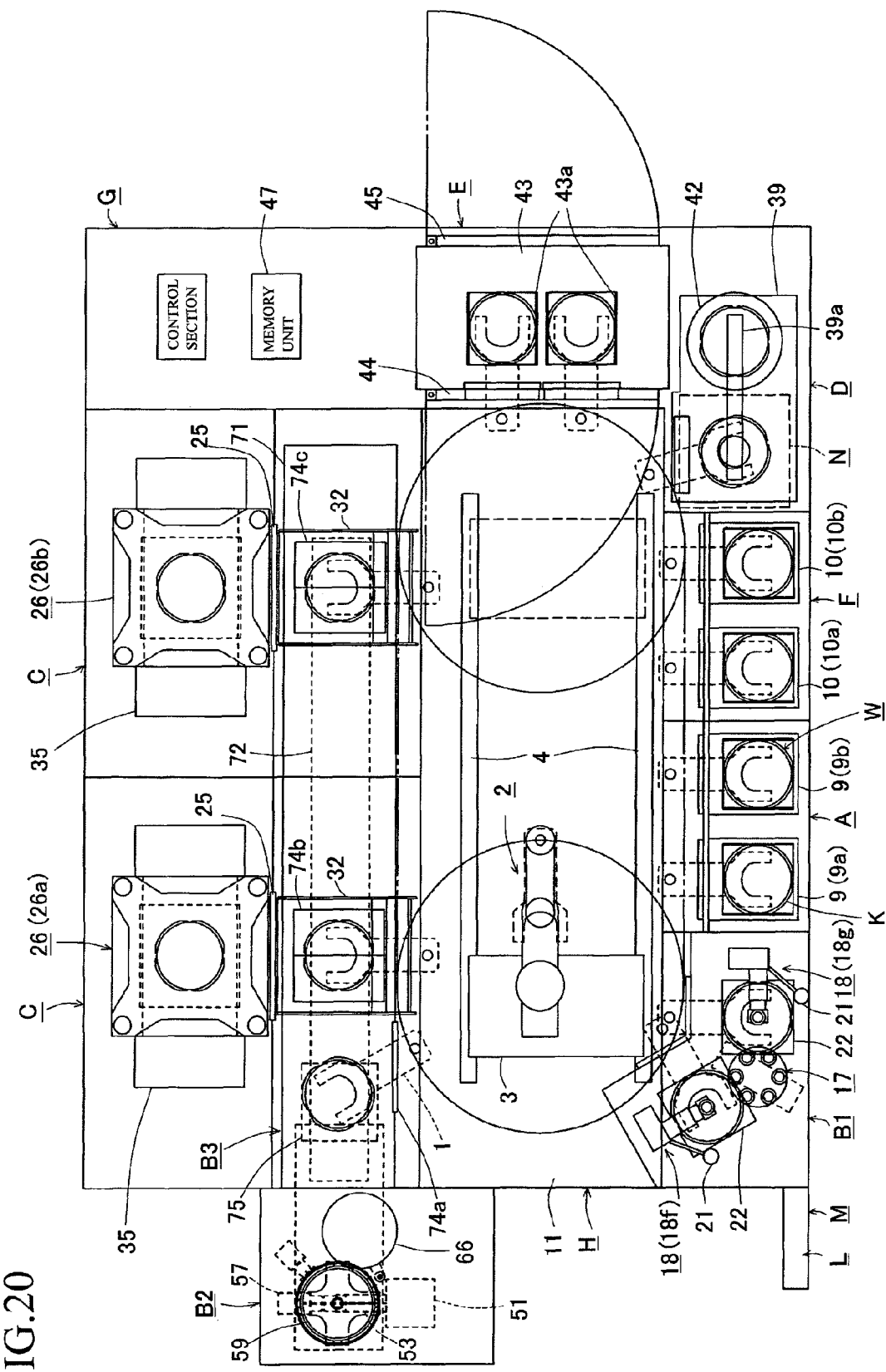
FIG. 20 is a plan view of another resin molding machine, which shows an overall structure.

FIG. 20 shows a planar layout of another embodiment of the resin molding machine relating to the present invention. The processing sections including the work feeding section A, a liquid resin feeding section B1, a granular resin feeding section B2, a work transferring mechanism B3, the press sections C, the work examination section (cooling section) D, the thermally-curing section E, the work accommodating section F and the control section G for controlling the processing sections are located to enclose the moving area of the articulated robot of the work conveying mechanism H. Note that, the structural elements described in the former embodiment are assigned the same symbols and explanation will be omitted. Unique points of the present embodiment will be mainly explained.

Figure 25:
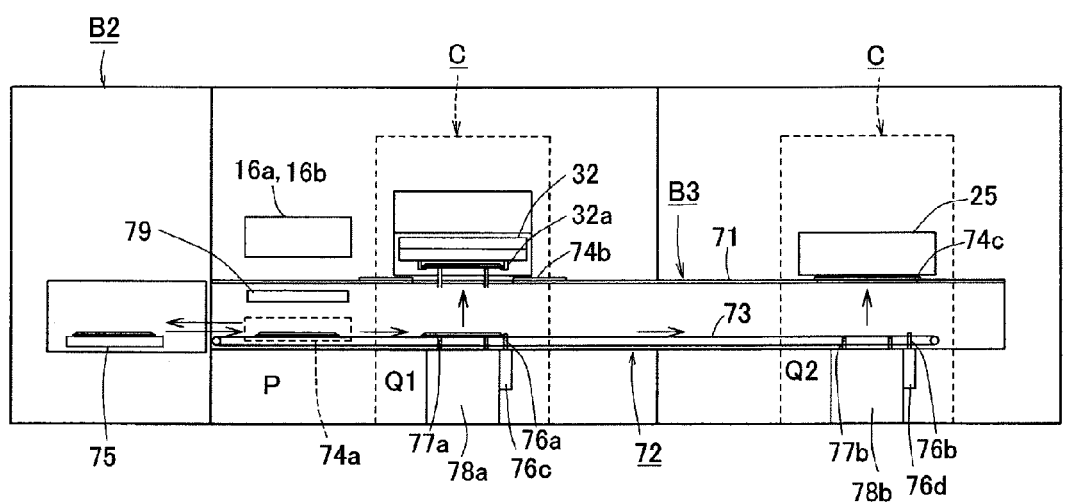
FIG. 25 is an explanation view of an example of the work conveying mechanism from the granular resin feeding section to the press section.

In the work transferring mechanism B3, a code reading unit 16a and an aligner 16b are provided to a windshield frame 71 (see FIG. 25). When the work W is conveyed into the windshield frame 71 from the work feeding magazine 9, the aligner 16b is turned to move the data code of the work W to a position immediately under the code reading unit 16a. In this action, the work W is headed in the prescribed direction. The code reading unit 16a reads the data code (e.g., QR code, barcode) attached to the work W. Resin data (e.g., type, amount fed, feeding time), molding data (e.g., assigned number of a press unit, pressing time, pressing temperature, thickness of resin molding), curing data (e.g., curing temperature, curing time), cooling data (e.g., cooling time), etc., which correspond to the data code, are stored in the memory unit 47. The conveyed work W is processed in the processing sections on the basis of the stored processing data corresponding to the data code read by the data reading unit 16a. The articulated robot 2 sequentially conveys the work W, whose processing data are read from the memory unit 47, to the following processing sections (from the resin feeding sections B1, B2 to the work accommodating section F).

Resin Feeding Sections B1 and B2

In FIG. 20, the liquid resin feeding section B1, whose structure is the same as that shown in FIG. 6, is adjacent to the work feeding section A located in a front part of the resin molding machine. The granular resin feeding section B2 is located on the inner side with respect to the conveying area of the work feeding mechanism H. Note that, the liquid resin feeding section B1 may be omitted.

Next, the granular resin feeding section B2 will be explained with reference to FIGS. 21A and 21B.

The granular resin feeding section B2 is capable of feeding granular resin. An amount of feeding the granular resin corresponds to that of the resin required for molding one work W. Note that, powder resin may be used instead of the granular resin. In FIG. 21A, the granular resin is stored in a hopper 51. A resin dropping section 52 includes a trough 53 for receiving the granular resin supplied from the hopper 51 and an electromagnetic feeder 54, which vibrates the trough 53 to send the granular resin toward the work W. The electromagnetic feeder 54 vibrates a pair of vibrating plates in a prescribed direction so as to send the granular resin in the trough 53.

A work mounting section 55, on which the work W is mounted, has an electronic weighing device (measuring section) 56 capable of measuring a weight of the granular resin dropped from the resin dropping section 52. A positioning jig 57, which guides and positions the side faces of the work W, is located above the electronic weighing device 56.

Figure 21B:
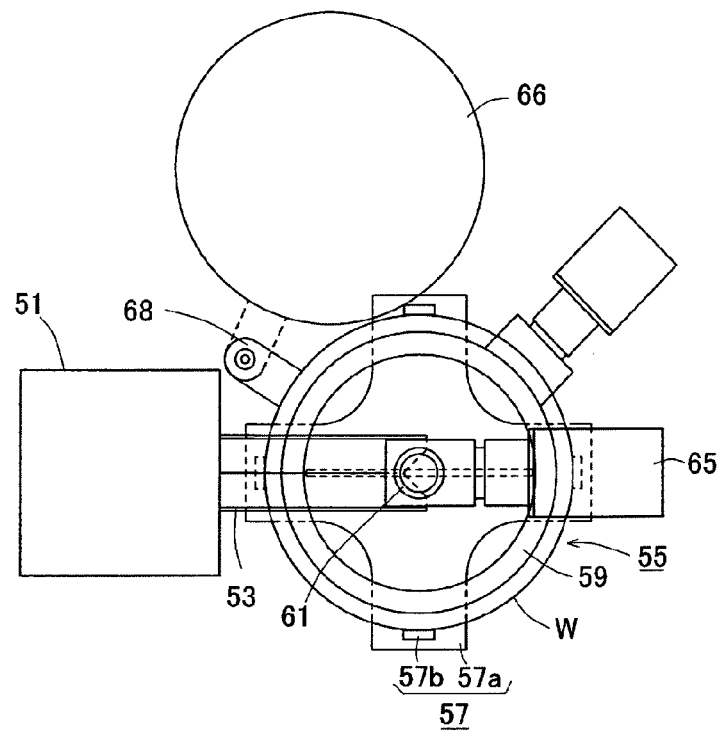
FIG. 21B is a plan view of the granular resin feeding section.

As shown in FIG. 21B, the positioning jig 57 includes a cross-shaped supporting table 57a and a pair of guide claws 57b, which face each other. The guide claws 57b respectively guide the side faces of the work W. Even if the work W is a circular work or rectangular work, the guide claws 57b, which face each other, guide the side faces of the work W, so that the center of the work W can be easily positioned at a prescribed position.

A leveling mechanism 58 is located above the work mounting section 55 and can be moved upward and downward. Concretely, a leveling blade 60, which has a prescribed vertical width, is rotatably held in an antiscattering frame 59. The leveling mechanism 58 sets the antiscattering frame 59 in the vicinity of the periphery of the work W so as to prevent scatter of the dropped granular resin. The leveling blade 60 is rotated and moved toward the granular resin, which has been dropped and heaped in the antiscattering frame 59, so as to level the dropped granular resin.

The leveling blade 60 is suspended from a motor shaft 61a of a blade driving motor 61. The blade driving motor 61 is integrated with an elevating slider 62. The elevating slider 62 is screwed with a ball bearing screw 64, which is rotated by a slider driving motor 63. By rotating the slide driving motor 63, the elevating slider 62 is moved upward and downward. The slider driving motor 63 and the elevating slider 62 are integrated with a blade supporting table 65.

With the above described structure, the granular resin, which has been dropped and heaped on the work W mounted on the work mounting section 55, is circularly leveled, by rotating the leveling blade 60 of the leveling mechanism 58, so that the work W can be fed in a state where the granular resin on the work W is leveled with uniform thickness. Therefore, producing bad products, e.g., lack of resin, can be prevented.

A tray 66 is provided in the vicinity of the work mounting section 55 and capable of moving into and away from a space between the antiscattering frame 59 and the work W. The tray 66 prevents the granular resin, which is dropped from the resin dropping section 52 (the trough 53), from sticking onto the work W except when the granular resin is fed. Concretely, a rotary arm 68 is integrated with a motor shaft 67a of a tray driving motor 67. The tray 66, which is formed into, for example, a circular shape, is fixed to a front end of the rotary arm 68. The tray 66 can be moved from an evacuating position, which is the position shown in FIG. 21B, to the space between the antiscattering frame 59 and the work W by actuating the tray driving motor 67 to rotate the rotary arm 68.

Therefore, the dropped granular resin is received by the tray 66 except when the granular resin is fed. Namely, no granular resin drops onto the work mounting section 55 from the resin dropping section 52, so that occurrence of weighing error can be prevented.

Figure 22:
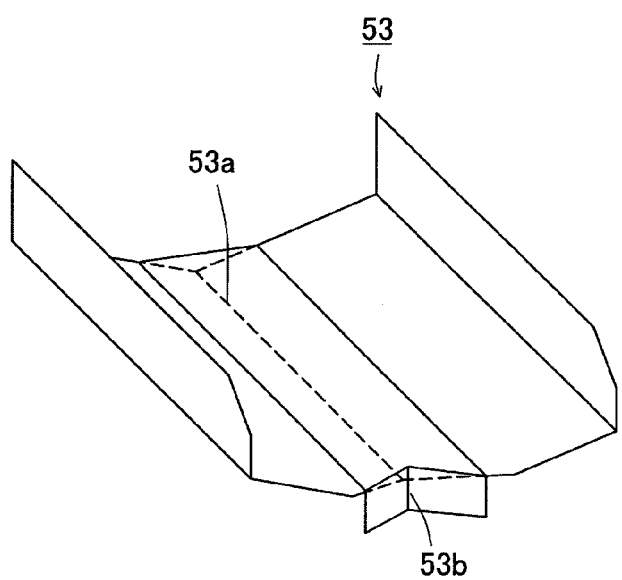
FIG. 22 is a perspective view of a trough of the granular resin feeding section.

As shown in FIG. 22, the trough 53 has a feeding groove 53a, which is extended in the longitudinal direction of the trough 53 and has a V-shaped section. Further, the trough 53 has a V-shaped part 53b, which is located at a downstream end of the trough 53.

With this structure, the motor shaft 61a of the motor 61, which rotates the leveling blade 60, can be extended, through the V-shaped part 53b located at the downstream end of the trough 53, to a position above the center of the work W. Further, the granular resin is introduced into the feeding groove 53a and sent to the downstream side, so that the granular resin can be heaped on the central part of the work W without being scattered.

Figure 23A:
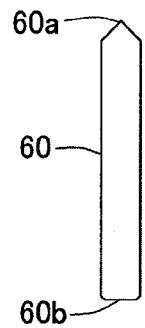
FIGS. 23A-23C are explanation views of leveling blades.

For example, the leveling blade 60 has a sectional shape shown in FIG. 23A, in which an upper end 60a is formed like a thin wedge and a lower end 60b is formed flat. With this structure, the upper end 60a makes it possible that all of the dropped granular resin can be fed onto the work W, without sticking onto the upper part of the blade 60, when the granular resin is dropped from the trough 53. The lower end 60b is capable of leveling the granular resin without pressing downward, so that the granular resin can be leveled without applying pressure to the semiconductor chips covered with the granular resin. For example, a front face of the leveling blade 60, which is a forward side face in the rotational direction, may be formed as a vertical face, and the other face (a rear side face) of the blade 60 may be formed as an inclined face so as to make the lower end 60b thin. With this structure, a friction surface can be reduced.

Figure 23B:
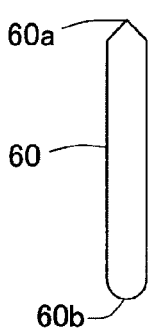

Another sectional shape of the leveling blade 60 is shown in FIG. 23B, in which the lower end 60b is rounded. With this structure, frictional resistance between the leveling blade 60 and the granular resin can be reduced and static generation can be prevented.

Figure 23C:
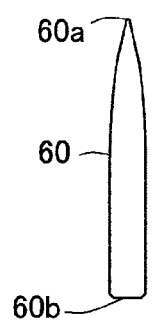

Further sectional shape of the leveling blade 60 is shown in FIG. 23C, in which a thickness of the leveling blade 60 is made thicker and the upper end 60a is made sharp. With this structure, sticking the granular resin onto the leveling blade 60 can be securely prevented.

In the resin dropping section 52, the trough 53 is vibrated, in the prescribed direction, by the electromagnetic feeder 54, so as to send the granular resin. If the electronic weighing device 56 of the work mounting section 55 detects a prescribed weight, which is less than a weight of feeding the granular resin, the electromagnetic feeder 54 is turned off. Note that, the prescribed weight is set in expectation of a weight of the granular resin which drops from the trough 53 onto the work W after stopping the electromagnetic feeder 54.

With this structure, the weight of the granular resin, which is fed from the resin dropping section 52 to the work W, can be measured within a prescribed error, and the granular resin can be stably fed.

Figure 21A:
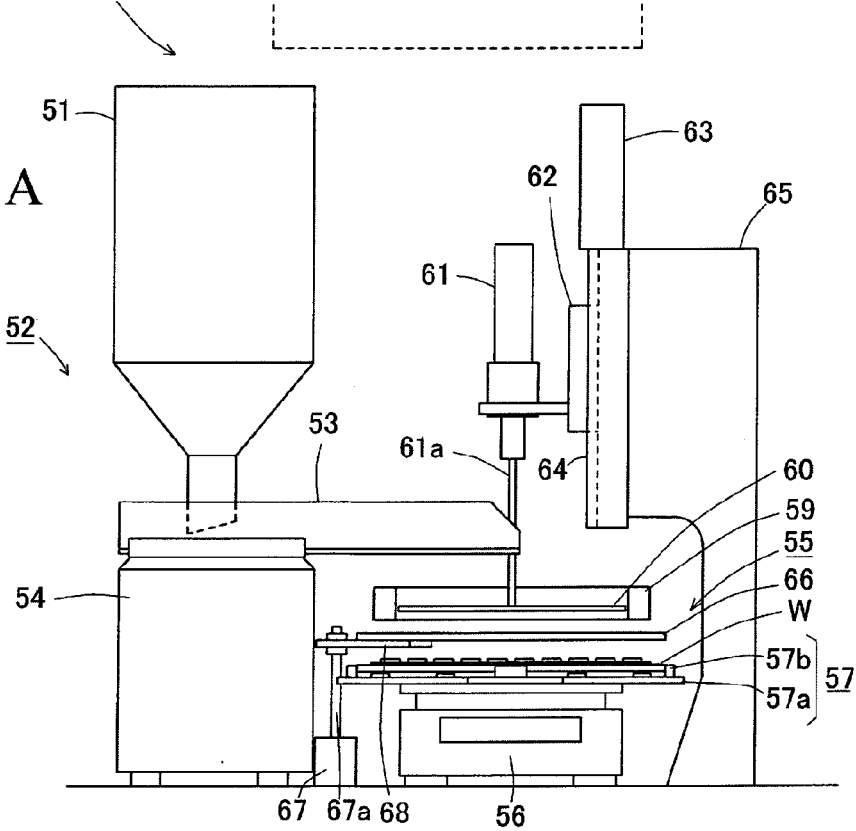
FIG. 21A is a front view of a granular resin feeding section.

As shown in FIG. 21A, an ionizer (electrostatic eraser) 69 is located above the work mounting section 55 so as to prevent the granular resin from electrostatically adhering onto the antiscattering frame 59 and the leveling blade 60. By preventing the electrostatic adhesion of the granular resin onto the antiscattering frame 59 and the leveling blade 60, variation of amount of feeding the granular resin can be prevented.

As shown in FIG. 24, a longitudinal central part 60c of the leveling blade 60, which is connected to the motor shaft 61a, may be bent upward. With this structure, the granular resin, which has been fed and heaped on the work W, is leveled, but only the central part of the resin is heaped. Therefore, when the work W is clamped in the press section C, air included in the molten resin can be easily purged through air vents.

Work Transferring Mechanism B3

Next, the work transferring mechanism B3, which transfers the work W from the granular resin feeding section B2 to the press section C, will be explained with reference to FIGS. 20 and 25.

As shown in FIG. 20, the work transferring mechanism B3 is located between the moving area of the articulated robot 2 and the press sections C. The work W, onto which the granular resin 70 has been fed from the granular resin feeding section B2, is transferred to the press section C by the work transferring mechanism B3 having a windshield.

As described above, the work transferring mechanism B3 having the windshield transfers the work W, onto which the granular resin 70 has been fed from the granular resin feeding section B2. Therefore, scattering resin powders from the work W can be prevented, so that handleability of the resin can be improved and maintenance of the mechanism can be reduced.

As shown in FIG. 25, the work transferring mechanism B3 includes a conveyor unit 72, which is capable of conveying the work W mounted thereon and which is provided in the windshield frame 71. The conveyor unit 72 has endless conveyor belts 73 being engaged with a pair of rollers. The conveyor belts 73 are two steel belts, from which no dusts are produced and which are arranged parallel with a prescribed clearance, in which a slider mechanism (described later) can be moved.

Since the work W, onto which the granular resin has been fed, is put on the conveyor belts 73 and transferred through the windshield frame 71, the work W can be transferred to the press section C with preventing scatter of resin powders and maintaining a clean state. Further, the resin-molding with liquid resin and the resin-molding with granular resin can be performed simultaneously.

Frame shutters 74a, 74b and 74c, which can be opened and closed, are provided in the windshield frame 71. The frame shutters 74a, 74b and 74c are respectively located at a position P, at which the work W is transferred from the robot hand 1, and positions Q1 and Q2, at each of which the work W is transferred from the windshield frame 71 to the press sections C. For example, the frame shutter 74a of the position P is located in a side face of the windshield frame 71, and the frame shutters 74b and 74c of the positions Q1 and Q2 are located in a ceiling of the windshield frame 71. The inner space of the windshield frame 71 is shielded from outside air, so that scattering resin powders produced from the granular resin can be prevented. For example, the actions of the robot hand 1 conveying the work W and air suction into an upper part of the resin molding machine for temperature control generate air streams in the resin molding machine. By the air streams, resin powders produced from the granular resin 70 will be scattered. However, in the present embodiment, the granular resin 70 is protected, by the windshield frame 71, from the air streams generated in the resin molding machine.

A slider mechanism 75 is provided to the position P in the windshield frame 71. The slider mechanism 75 receives the work W from the robot hand 1, transfers the work W to the granular resin feeding section B2 and sets the work W in the positioning jig 57, and transfers the work W, on which the granular resin 70 is fed, to the position P.

Work detection sensors (not shown), which detect that the work W passes the positions Q1 and Q2, are provided to the positions Q1 and Q2. And, stoppers 76a and 76b, which makes the work W transferred by the conveyor belts 73 stop at a prescribed stopping position, are provided at the positions Q1 and Q2. Further, position detection sensors 76c and 76d, which detect the work W transferred to the positions Q1 and Q2, are provided to the positions Q1 and Q2. When the work detection sensors detect the work W, the conveyor unit 72 is stopped.

Work mounting sections 77a and 77b, which are capable moving upward and downward, are provided between the conveyor belts 73 and respectively located at the positions Q1 and Q2. By moving the work mounting sections 77a and 77b upward, by air cylinder units, from positions under the conveyor belts 73, the work mounting sections 77a and 77b receive the works W and moved upward. The frame shutter 74b or 74c, which are provided in the ceiling of the windshield frame 71, is opened so as to transfer the work W to a loader hand 32a of the loader 32 of the press section C. Note that, the press sections C and the work transferring mechanism B3 is divided by press-side shutters 25. The work W transferred to the loader hand 32a is set into the press section C, whose molding die set has been opened, by the loader 32.

A preheating section 79 is provided in the windshield frame 71 and located at a position above the position P (on the upstream side in the work transferring direction). The preheating section 79 preheats the work W, onto which the granular resin 70 has been fed from the granular resin feeding section B2, so as to heat the granular resin 70.

By preheating the granular resin 70, required time for melting the granular resin 70 in the press sections C can be shortened. Surface of the granular resin 70 may be molten by preheating at high temperature. In this case, scattering resin powders can be highly prevented. Note that, the preheating section 79 may be omitted.

Action for feeding the granular resin to the work W in the granular resin feeding section B2 will be explained with reference to FIGS. 26A-27C.

Figure 26A:
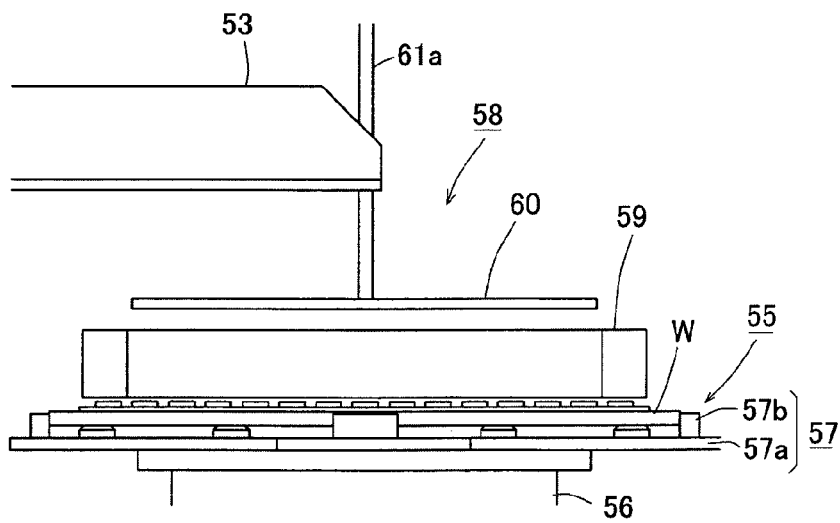
FIGS. 26A-26C are explanation views of feeding granular resin.

In FIG. 26A, the antiscattering frame 59 is moved close to the work W, which has been set in the positioning jig 57 of the work mounting section 55.

Figure 26B:
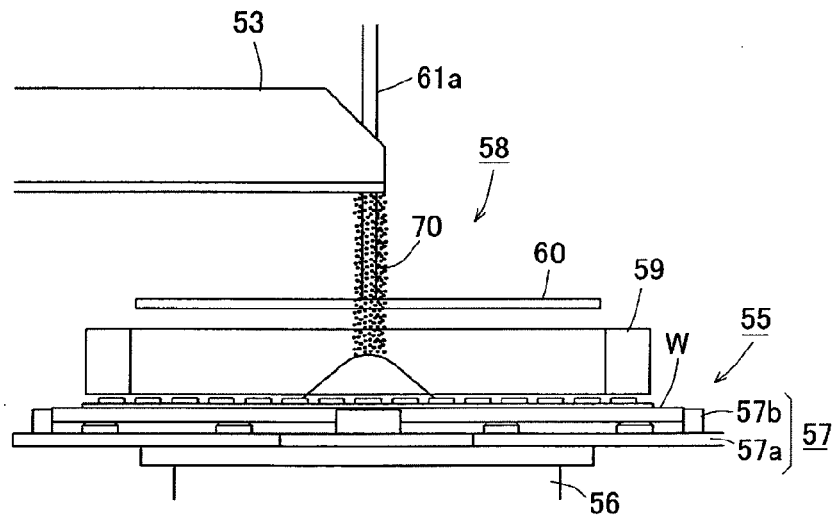

Next, as shown in FIG. 26B, the granular resin 70, which has been fed from the hopper 51 to the feeding groove 53a of the trough 53, is sent toward the downstream end by actuating the electromagnetic feeder 54. Therefore, the granular resin 70 sequentially is dropped onto the work W from the V-shaped part 53b. The granular resin 70 falls around the motor shaft 61a and passes the both sides of the leveling blade 60, so that the granular resin 70 is heaped on the central part of the work W. Even if the granular resin 70 is dropped onto the work W and scattered, the scatter is restrained by the antiscattering frame 59 and no resin flies out from the work W. Note that, when a measured value of the electronic weighing device 56 reaches a prescribed value, the electromagnetic feeder 54 stops feeding the granular resin 70.

Figure 26C:
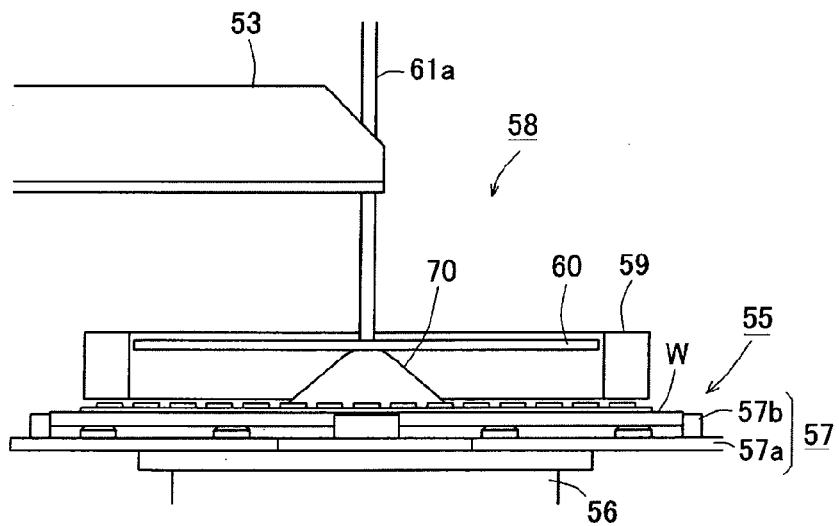

Next, as shown in FIG. 26C, the slider driving motor 63 is started to move the elevating slider 62 downward without changing the height of the antiscattering frame 59, and the blade driving motor 61 is started to rotate the leveling blade 60. And then, the rotating blade 60 is downwardly moved into the antiscattering frame 59. With this action, the granular resin 70, which has been heaped in the central part of the work W, is gradually leveled and extended toward the outer edge of the work W. At that time, the granular resin 70, which is heaped on the front side of the leveling blade 60 in the rotational direction and whose height is higher than that of the leveling blade 60, overrides the leveling blade 60 and falls on the rear side thereof. Further, the granular resin 70 is repeatedly leveled by the leveling blade 60, so that the granular resin 70 on the work W can be uniformly leveled. Note that, the upper end 60a of the leveling blade 60 is convexly formed, so no granular resin 70 sticks thereon. The prescribed width of the leveling blade 60 is designed that the granular resin 70 can override the leveling blade 60 while leveling the granular resin 70. Therefore, the amount of the granular resin 70 heaped on the front side of the leveling blade 60 can be suitably controlled. Component force downwardly applied to the work W, which is generated by pushing the heaped granular resin 70 with the leveling blade 60, can be reduced, so that loads applied to the semiconductor chips can be highly reduced.

Figure 27A:
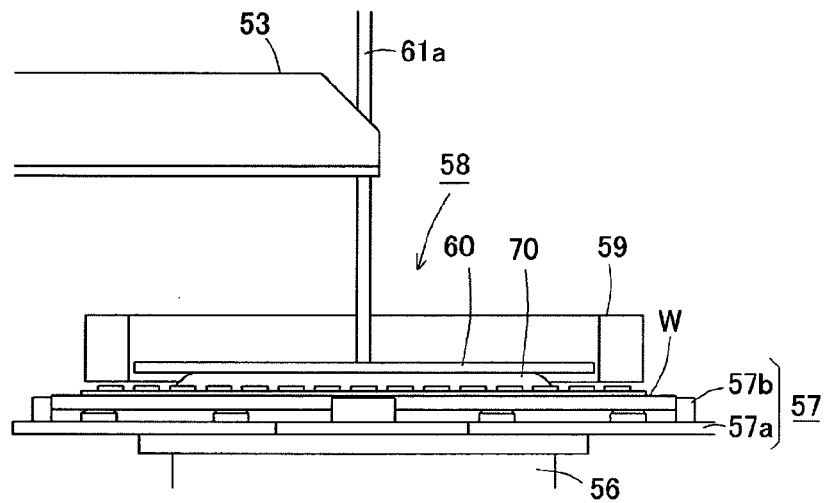
FIGS. 27A-27C are explanation views of actions following the action shown in FIG. 26C.
Figure 27B:
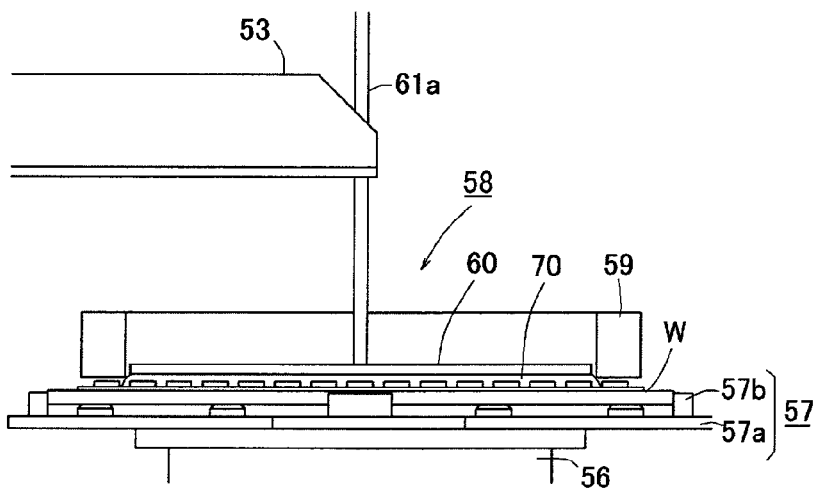

FIG. 27A shows a state where leveling the granular resin 70 is advanced from the state shown in FIG. 26C. Next, as shown in FIG. 27B, the granular resin 70 is extended close to the antiscattering frame 59, so that the granular resin 70 is leveled with uniform thickness. In this state, the leveling step is completed. Note that, the antiscattering frame 59 acts as a partition wall above the work W, and the semiconductor chips are mounted on the work W, so concavities and convexities are formed on the work W. Therefore, no granular resin 70 gets out from the outer edge of the work W.

Figure 27C:
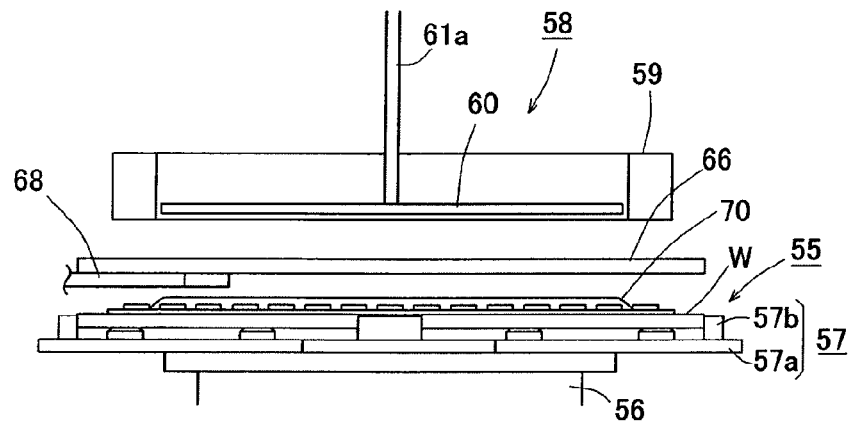

Next, as shown in FIG. 27C, the antiscattering frame 59 and the leveling blade 60 are moved upward. Further, the tray driving motor 67 is started to rotate the rotary arm 68, and the tray 66 is moved into the clearance between the antiscattering frame 59 and the work W, so that sticking surplus granular resin 70 and resin powders onto the work W can be prevented.

The work W is moved to the position P in the windshield frame 71, by the slider mechanism 75 (see FIG. 25), and transferred onto the conveyor belts 73. The work W on the conveyor belts 73 is preheated by the preheating section 79, if required. Then, the work W is conveyed to the press section C and transferred to the loader 32 of the press section C. For example, in case that heating time in the press section C is too long due to a type of the granular resin 40 or a thickness of the work W, preheating the work W is highly effective.

The work W, on which the liquid resin has been fed from the liquid resin feeding section B1, is transferred to the work mounting sections 77a or 77b, which is upwardly moved through the opened frame shutter 74b or 74c of the windshield frame 71. And then, the work W is transferred to the loader hand 32a of the loader 32 of the press section C.

In the resin molding machine of the present embodiment, the sequential processing actions, including feeding the work W and the resin, resin-molding the work W, examining the molded work W, post-curing the molded work W and accommodating the molded work W, can be efficiently performed, by the compact structure. The resin molding machine can efficiently mold works under specs of products. The liquid resin and the granular resin can be selectively used for resin-molding different works. By controlling the conveying actions of the articulated robot 2 so as to sequentially perform the actions of feeding the works to the press sections C and taking out the molded works therefrom, the molding actions can be continuously performed in the press sections C.

Note that, in the resin molding machine of the present embodiment, the guide rails 4 and the conveyor unit 72 may be extended. In this case, number of the processing sections, e.g., the press section C, may be increased without changing the existing structure. In case that moving the articulated robot 2 along the guide rails 4 and actuating the robot hand 1 of the articulated robot 2 are simultaneously performed, the work W can be conveyed rapidly. Even if number of the processing sections, e.g., the press section C, are increased and the total length of the resin molding machine is elongated, the resin molding can be performed without reducing the conveying speed of the work W.

Note that, a writing-type granular resin feeding section, which is capable of dropping the granular resin like dots or lines, may be employed instead of the granular resin feeding section B2 including the leveling blade 60. As shown in FIGS. 28A-30B, the writing-type granular resin feeding section B20 feeds the granular resin, like a rectangular form, to a square work W. Note that, the granular resin feeding section B20 feeds the granular resin as if drawing lines. Therefore, in case of using a circular work W, the granular resin may be fed, onto the circular work, as if drawing concentric circles.

In case of using optionally-shaped work W (e.g., rectangular work, polygonal work, irregularly-shaped work) too, the granular resin can be fed in the predetermined form, which is previously defined by an input unit. Therefore, the granular resin can be easily fed to many types of works. Further, the granular resin can be fed in the form of radial lines, with respect to the center of the work W, with prescribed angular separations. By feeding the granular resin as if drawing dots or lines, an optional amount of the resin can be fed to an optional position. For example, if an amount of feeding the granular resin to a mounting area, in which the semiconductor chips 129 are mounted, is less than an amount of feeding the granular resin to other areas (e.g., an area in which a substrate 128 is exposed), an upper surface of the granular resin layer can be leveled, or concavities and convexities can be removed. Therefore, flow of the resin can be restrained, so that wire-flow can be prevented.

The granular resin feeding section B20 includes a stage 131 capable of holding the work W, an X-Y-Z driving mechanism for moving the stage 131 in the X-, Y- and Z-directions, and a weighing device (weight sensor) 157 for measuring the weight of the work W including the weight of the granular resin fed onto the work W. A through-hole 131a is formed in the center of the stage 131, so the stage 131 sucks and holds the work W by an outer edge part. Note that, an outer periphery of the work W may be held by claw members of the stage 131. The weight sensor 157 is pierced through the through-hole 131a of the stage 131 so as to measure the weight of the work W.

In the X-Y-Z driving mechanism 133, an X-slider 135 is slid, in the X-direction, on an X-rail 134, a Y-slider 136 is slid, in the Y-direction, on a Y-rail fixed on the X-slider 135. Further, a Z-slider 156 is slid, in the Z-direction, on a Z-rail 155 fixed on the Y-slider 136. The sliders are respectively driven by known driving units (not shown).

The granular resin feeding section B20 includes a resin dropping section 132, e.g., shooter, which is capable of dropping the granular resin, onto the work W, from a lower end. For example, the granular resin feeding section B20 has the structure for dropping the granular resin, which is similar to that of the granular resin feeding section B2. Namely, the granular resin is dropped from the trough 53 and fed onto the work W via the shooter. In this case, the lower end of the resin dropping section 132 may be made small by the shooter so as to correctly feed a prescribed amount of the granular resin to a prescribed position in the horizontal surface of the work W. Therefore, the granular resin can be correctly fed as if writing dots or lines. The resin feeding position can be precisely controlled. The granular resin is fed from the shooter, which is downwardly extended close to the work W, and scattering resin powders can be prevented without using the antiscattering frame 59 (see FIGS. 21A and 21B). As shown by dotted lines in FIG. 28A, an inner diameter of a lower end part of the shooter (the resin dropping section 132) may be gradually reduced. With this structure, an inclined section, whose inclination angle is greater than a repose angle of the granular resin, can be formed in the lower end part of the shooter, so that excessively-heaping the granular resin at the resin dropping position of the work W can be prevented. In this case, the granular resin dropped from the trough 53 collides with the inclined section so as to reduce its speed, and then the granular resin is dropped onto the work W, so that kinetic energy of the granular resin dropped onto the work W can be reduced. Therefore, even if fine wires of the semiconductor chips are bonded in the work W, the resin can be fed without damaging the fine wires.

Figure 28A:
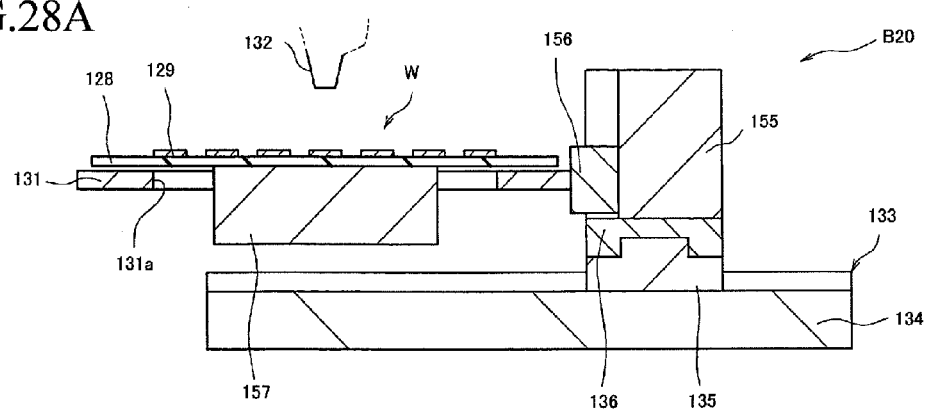
FIGS. 28A-28C are explanation views of another granular resin feeding process.
Figure 28B:
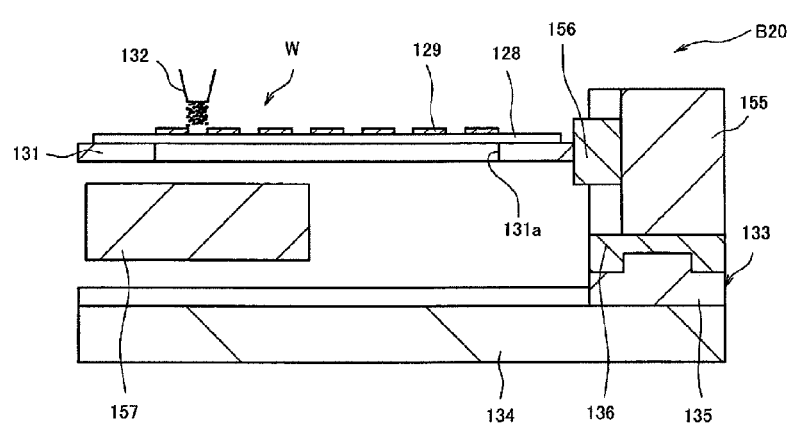
Figure 28C:
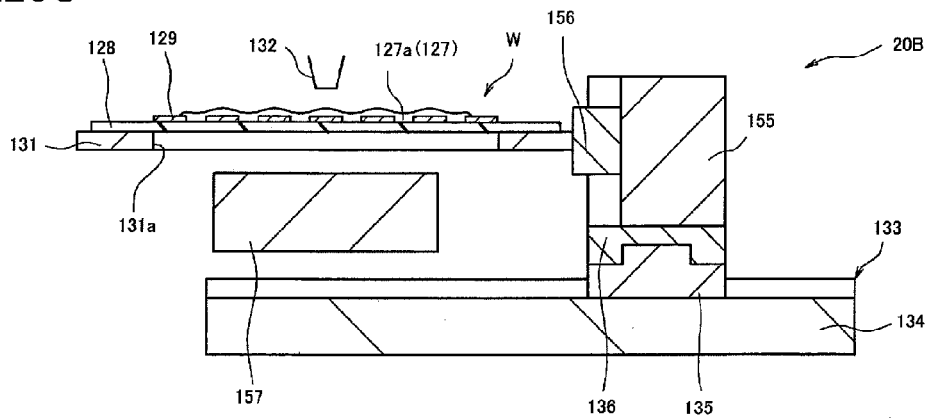
Figure 29:
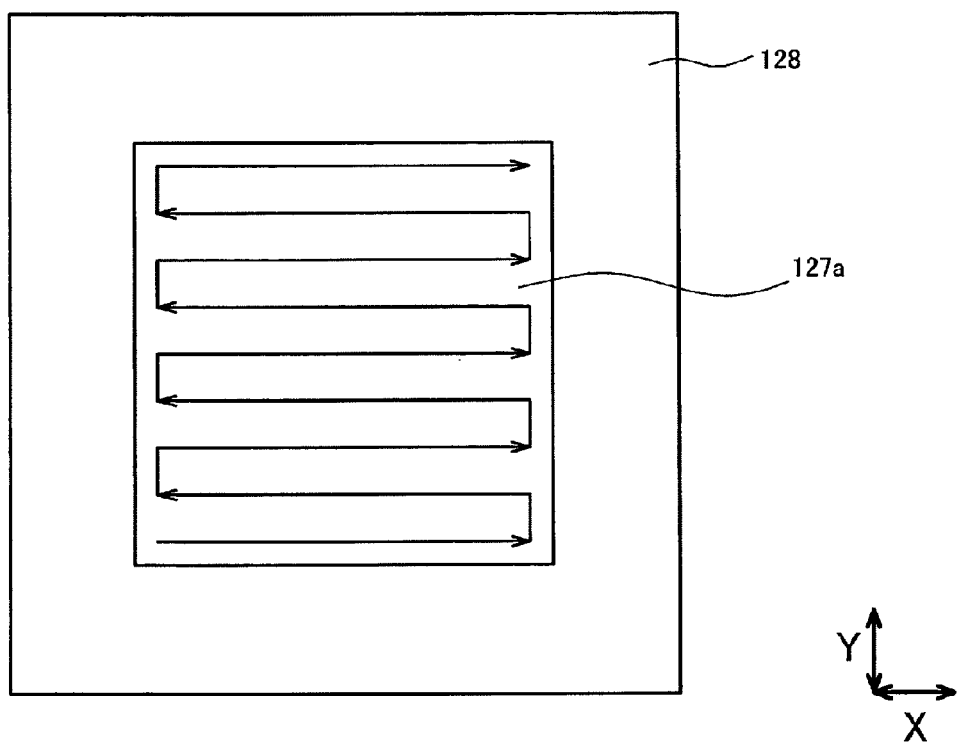
FIG. 29 is an explanation view of an action following the action shown in FIG. 28C.

In the granular resin feeding section B20, firstly the work W is received by the stage 131, and then the stage 131 is moved downward, as shown in FIG. 28A, so as to mount the work W onto the weighing device (weight sensor) 157 to measure the weight of the work W. Next, the slider 156 is moved upward (in the Z-direction) to transfer the work W from the weighing device 157 to the stage 131. The granular resin is fed (dropped) onto the work W on the basis of the resin feeding data (amount of feeding the resin). In the granular resin feeding section B20, the most part (e.g., about 90%) of the total amount of feeding the resin is firstly fed to the work W as a first feeding step. In the first feeding step, the granular resin is dropped, onto the work W, from the lower end of the resin dropping section 132 (see FIG. 28B), with zigzag-moving the stage 131, so that the granular resin is fed onto the work W in the zigzag form (see FIG. 29). With this step, a base resin part 127a is formed on the work W (see FIG. 28C).

Figure 30A:
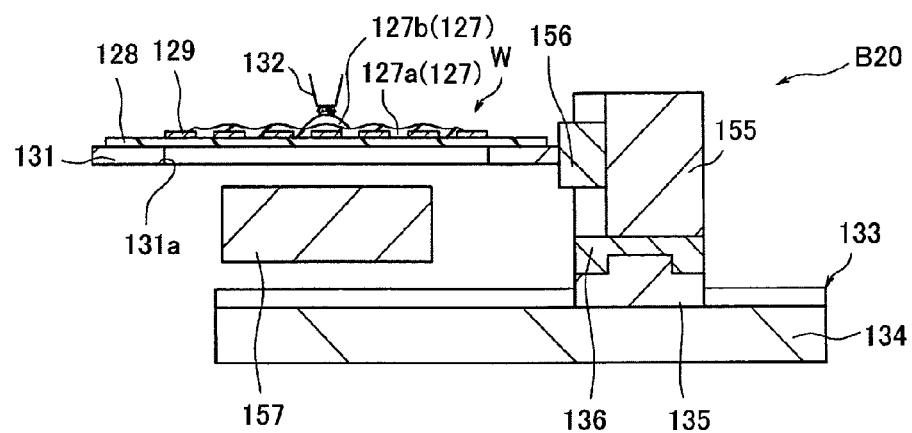
FIG. 30 is an explanation view of an action following the action shown in FIG. 29.
Figure 30B:
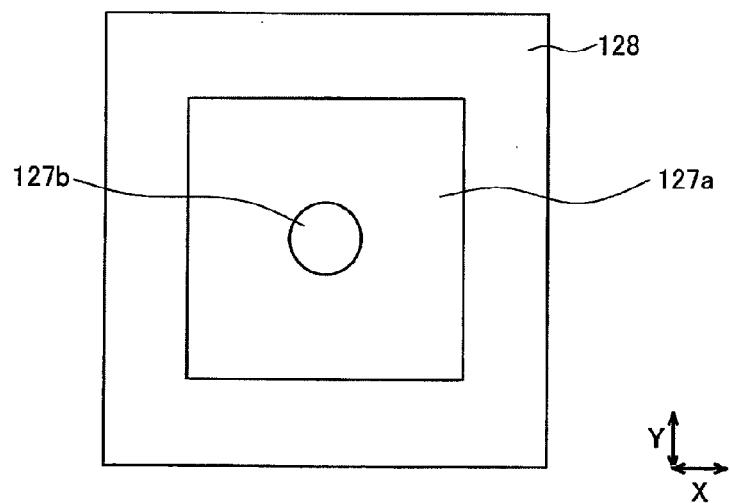

Next, in the granular resin feeding section B20, a part of the rest granular resin, whose amount (e.g., about 10%) is obtained by subtracting the amount of the granular resin fed in the first feeding step from said total amount, is fed as a second feeding step. As shown in FIGS. 30A and 30B, in the second feeding step, the granular resin is fed onto the center of the work W from the lower end of the resin feeding section 132 so as to form a medium-heaped part 127b of the granular resin on the base resin part 127a.

After the prescribed amount of the granular resin is fed onto the work W, the stage 131 is moved to a prescribed position, and the weight of the work W, on which the granular resin has been fed, is measured, by the weighing device 157, again. The measured value is stored as an actual amount of feeding the granular resin. If the second measured value is slightly small, the rest granular resin may be further fed to the work W. Note that, if the granular resin can be highly precisely fed, the total amount of the granular resin may be fed in the first feeding step only.

In the above described embodiment, the works W are transferred in the windshield frame 71, but the present invention is not limited to the embodiment. For example, as shown by tow-dot chain lines in FIGS. 2A and 2B, a box-shaped windshield, which encloses a work holding position of the robot hand 1, may be provided, and the work W, on which the resin has been fed, may be conveyed to the press section C in a state where the work W is shielded by the windshield. In this case, scattering the granular resin can be prevented. Note that, the robot hand 1 having the windshield and another robot hand 1 having no windshield may be provided to the articulated robot, and the robot hand 1 having the windshield may be only used to convey the work W from the granular resin feeding section B2 or B20 to the press section C.

After the work W is taken out from the press section C, the work W may be inverted at optional time point to face the molded face downward and conveyed to the following processing sections and accommodated in this state. In this case, sticking dusts on the cured resin can be effectively prevented.

The leveling blade 60 may be linearly moved to level the heaped resin. For example, the leveling blade 60 may be reciprocally moved, on the granular resin 70 heaped on the central part of the work, in the horizontal plane so as to level the heaped resin 70. In this case, a frame, in which a small hole whose size is sufficiently smaller than that of the cavity is formed, is provided, and the granular resin 70 is extended by sliding the leveling blade 60 on an upper face of the frame. Further, after the granular resin 70 is fed onto the work W in the form of lines, the resin may be leveled by moving the leveling blade in the transverse direction of the lines of the resin. In this case, a structure and a step for feeding the granular resin 70 in the square form can be simplified.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alternations could be made hereto without departing from the spirit and scope of the invention.

What is claimed is:

1. A resin molding machine, comprising:
   a work conveying mechanism having a hand for holding a work and being capable of conveying the work to processing sections;
   a work feeding section for feeding the work;
   a resin feeding section for feeding resin, which is used for resin molding, to the work conveyed from the work feeding section;
   a press section, in which the work is set and resin-molded with the resin fed by the resin feeding section;
   an external shape examination section having means for photographing images of the resin-molded products at a time or respectively to examine if a faulty point exists;
   a post-curing section including a curing furnace, in which pairs of slits arranged in the vertical direction at regular separations for holding the resin-molded works are provided, the post-curing section post-curing the resin-molded and examined works, which have been held by the pairs of slits, by tightly closing the curing furnace, for a time longer than curing times of the press section;
   a work accommodating section for accommodating the resin-molded work which has been post-cured in the post-curing section;
   means for controlling actions of the entire resin molding machine, wherein the post-curing section is located in a part of a work conveying route between the press section and the work accommodating section;
   a plurality of openings facing the work conveying route on a side wall of the curing furnace, each of which corresponds to the pairs of slits vertically arranged;
   a plurality of open-close doors for respectively opening and closing the openings, wherein the open-close doors usually close the openings; and
   an articulated robot having a robot hand, wherein the articulated robot is configured to move the robot hand to hold the resin-molded work into or out from the curing furnace when the open-close door is opened.

2. The resin molding machine according to claim 1, wherein the work conveying mechanism has a data reading section, which reads product data including molding conditions before the work is set in the press section.

3. The resin molding machine according to claim 1, wherein the control section controls timing of feeding the work and taking out the work to correspond to a minimum motion cycle of a process whose processing time is longest, and controls the work conveying action with considering priority order of processes.

4. The resin molding machine according to claim 1,
wherein the resin feeding section includes pluralities of dispensing units for feeding liquid resin, and
an amount of dispensing the liquid resin from each of the dispensing units is previously calculated.

5. The resin molding machine according to claim 1,
wherein the resin feeding section includes a dispensing unit, in which the liquid resin is dispensed from a tube nozzle by press-fitting a piston into a syringe, and
a pinch valve closes the tube nozzle so as to prevent the liquid resin from being dropped therefrom.

6. The resin molding machine according to claim 1,
wherein the molding die set includes a work supporting section,
the work supporting section supports a carrier plate having a semiconductor chip holding face, on which resin is fed, in a state where the carrier plate is separated from a clamping face of a molding die, and
the work supporting section is capable of retracting into the molding die set from the clamping face while the molding die set is in a clamping state.

7. The resin molding machine according to claim 1,
wherein the molding die set includes an upper clamper and a lower clamper, which enclose a cavity of the molding die set,
a die space is formed in the molding die set by closing the upper clamper and the lower clamper,
a negative pressure is generated in the die space before the molding die set clamps the work, and then the molding die set clamps the work to compression-mold the work.

8. The resin molding machine according to claim 1,
wherein the molding die set includes a work supporting section,
the work supporting section supports a carrier plate having a semiconductor chip holding face, on which resin is fed, in a state where the carrier plate is separated from a clamping face of a molding die, and
the work supporting section includes pluralities of float pins, which are floating-supported, in a lower cavity piece, by an elastic member.

9. The resin molding machine according to claim 1,
wherein the molding die set includes a work supporting section,
the work supporting section supports a carrier plate having a semiconductor chip holding face, on which resin is fed, in a state where the carrier plate is separated from a clamping face of a molding die, and
the work supporting section is located outside of a mounting area of a semiconductor chip.

10. The resin molding machine according to claim 1,
wherein the resin for molding is fed to the work, which has been taken out from the work feeding section, in the resin feeding section, and
the work, to which the resin has been fed, is conveyed to the press section in a state where the work is shielded by a windshield.

11. The resin molding machine according to claim 1,
wherein the resin feeding section includes a granular resin feeding unit for feeding granular resin onto the work,
a work transferring mechanism, which has a windshield and which transfers the work on which granular resin has been fed by the granular resin feeding unit, is provided between the moving area of the robot and the press section, and
the work transferring mechanism includes a conveyor unit having an endless conveyor belt, which transfers the work and which is located in a tunnel-shaped windshield frame.

12. The resin molding machine according to claim 1,
wherein the work transferring mechanism includes a tunnel-shaped windshield frame, and
a preheating section, which preheats the granular resin fed to the work, is provided in the windshield frame and located in an upper part of the windshield frame on an entrance side.

13. The resin molding machine according to claim 1,
wherein the resin feeding section includes a granular resin feeding unit, which feeds granular resin onto the work, and a liquid resin feeding unit, which feeds liquid resin onto the work.

14. The resin molding machine according to claim 1,
wherein the resin feeding section includes a granular resin feeding unit, which feeds granular resin onto the work, and
the granular resin feeding unit comprises:
  a hopper for storing the granular resin;
  a resin dropping section for dropping the granular resin, which has been fed from the hopper, onto the work;
  a work mounting section having a measuring unit, on which the work is mounted and which measures a weight of the granular resin fed onto the work; and
  a leveling mechanism including a rotatable leveling blade, the leveling mechanism leveling the granular resin, which has been fed on the work, by rotating the leveling blade and moving the same toward the granular resin.

15. The resin molding machine according to claim 1,
wherein the resin feeding section includes a granular resin feeding unit, which drops granular resin onto the work, and
an antiscattering frame, which prevents scattering of the granular resin fed on the work, is located close to periphery of the work mounted on the work mounting section.

16. The resin molding machine according to claim 14,
wherein a tray is capable of moving into and away from a space between the resin dropping section and the work, and
the tray gets into the space except when the granular resin is fed, so as to prevent the dropped granular resin from sticking onto the work.

* * * * *